(12) United States Patent
Maeda et al.

(10) Patent No.: US 8,394,726 B2
(45) Date of Patent: Mar. 12, 2013

(54) METHOD FOR MANUFACTURING SEMICONDUCTOR DEVICE, AND SUBSTRATE PROCESSING APPARATUS

(75) Inventors: Takahiro Maeda, Toyama (JP); Nobuo Owada, Ome (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/458,903

(22) Filed: Jul. 27, 2009

(65) Prior Publication Data

US 2010/0029089 A1 Feb. 4, 2010

(30) Foreign Application Priority Data

Jul. 31, 2008 (JP) ................................. 2008-198202
Jul. 10, 2009 (JP) ................................. 2009-163547

(51) Int. Cl.
*H01L 21/31* (2006.01)
(52) U.S. Cl. ................. 438/761; 257/E21.211
(58) Field of Classification Search .................. 438/478, 438/758, 761; 257/E21.211
See application file for complete search history.

(56) References Cited

U.S. PATENT DOCUMENTS

| 5,021,522 | A | | 6/1991 | Durairaj et al. |
| 5,049,641 | A | | 9/1991 | Hood et al. |
| 5,635,408 | A | | 6/1997 | Sano et al. |
| 5,837,580 | A | * | 11/1998 | Thakur et al. ................. 438/255 |
| 6,069,053 | A | | 5/2000 | Ping et al. ..................... 438/398 |
| 6,235,613 | B1 | * | 5/2001 | Nuttall .......................... 438/482 |
| 6,238,478 | B1 | * | 5/2001 | Habuka ........................ 117/19 |
| 2003/0030070 | A1 | * | 2/2003 | Hirose .......................... 257/197 |
| 2003/0201540 | A1 | | 10/2003 | Ahn et al. |
| 2004/0053515 | A1 | * | 3/2004 | Comita et al. ................ 438/795 |
| 2005/0020037 | A1 | * | 1/2005 | Asami et al. .................. 438/485 |
| 2008/0271675 | A1 | * | 11/2008 | Choi et al. .................... 118/715 |
| 2010/0012030 | A1 | * | 1/2010 | Todd et al. .................... 118/708 |

FOREIGN PATENT DOCUMENTS

| JP | A-61-295644 | 12/1986 |
| JP | A-07-302922 | 11/1995 |
| JP | A-2002-334869 | 11/2002 |
| JP | A-2004-47956 | 2/2004 |
| JP | A-2005-56910 | 3/2005 |
| KR | 1991-0002764 | 5/1991 |

OTHER PUBLICATIONS

Jul. 27, 2011 Office Action issued in Korean Patent Application No. 10-2009-0069045 (with translation).
Apr. 20, 2012 Notification of Submission of Opinions issued in Korean Patent Application No. 10-2009-0069045 (with English-language translation).

* cited by examiner

*Primary Examiner* — William D Coleman
*Assistant Examiner* — Christine Enad
(74) *Attorney, Agent, or Firm* — Oliff & Berridge, PLC

(57) ABSTRACT

A method for manufacturing a semiconductor device includes the steps of: loading a substrate into a reaction chamber; supplying reactive gases into the reaction chamber and processing the substrate; and unloading the processed substrate from the reaction chamber, wherein the step of processing the substrate includes: a first film formation step of setting the substrate to a first temperature and forming a first silicon film including impurity atoms on the substrate and a second film formation step of setting the substrate to a second temperature, which is lower than the first temperature, and forming a second silicon film that includes no impurity atoms or has an impurity concentration lower than that of the first silicon film on at least the first silicon film.

11 Claims, 17 Drawing Sheets

FIG. 3
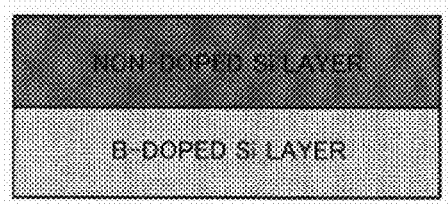
(A) B-DOPED/NON-DOPED Si FILM
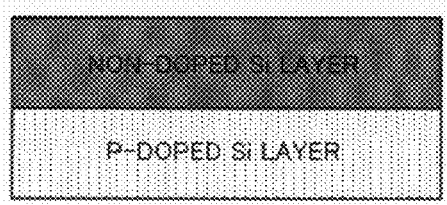
(B) P-DOPED/NON-DOPED Si FILM
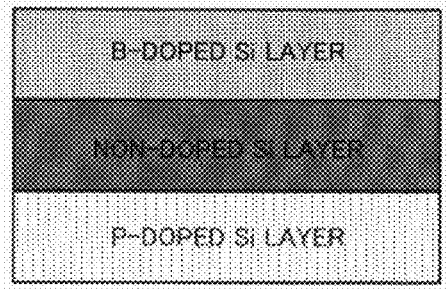
(C) P-DOPED/NON-DOPED
/B-DOPED Si FILM
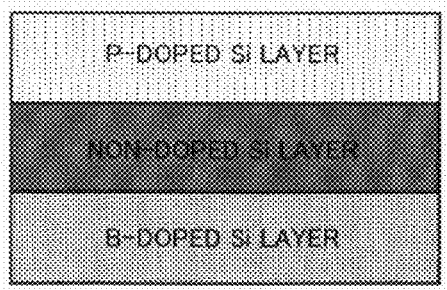
(D) B-DOPED/NON-DOPED
/P-DOPED Si FILM

METHOD FOR MANUFACTURING SEMICONDUCTOR DEVICE, AND SUBSTRATE PROCESSING APPARATUS

BACKGROUND OF THE INVENTION

1. Field of the Invention

The present invention relates to a method for manufacturing a semiconductor device, and a substrate processing apparatus, and more particularly to a method for manufacturing a semiconductor device that includes a step of forming a silicon film on a substrate, and a substrate processing apparatus having a controller that performs control so as to form a silicon film on a substrate.

2. Description of the Related Art

Silicon nitride films and the like have been conventionally formed on a semiconductor wafer by a CVD method. For example, a method for forming a silicon nitride film on a Si film is known by which HCD (hexachlorodisilane: $Si_2Cl_6$) and $NH_3$ (ammonia) are supplied as reactive gases into a reaction chamber heated to and maintained at 500-800° C. (see, for example, Japanese Patent Application Laid-open No. 2002-334869).

Other known methods include a method of forming a non-doped Si film by using $SiH_4$ (monosilane), $Si_2H_6$ (disilane), or the like as the reactive gas and a method of forming a P-doped (phosphorus-doped) Si film and B-doped (boron-doped) Si film by adding $PH_3$ (phosphine) to $SiH_4$ (monosilane) or $Si_2H_6$ in the reactive gas in order to cause diffusion of B (boron) or P (phosphorus) as impurity when a Si (silicon) film is formed by a low-pressure CVD method.

When a Si film is formed by a lower-pressure CVD method, an impurity doped Si film and a non-doped Si film are sometimes formed continuously as a laminated structure. For example, according to a typical film lamination sequence diagram of a P-doped Si film and a non-doped Si film shown in FIG. 17, a Si wafer is carried (loaded) into a reaction chamber, the temperature inside the reaction chamber is stabilized at 600° C., $SiH_4$ and $PH_3$ are supplied as reactive gases and a P-doped Si film is formed. Then, a non-doped Si film is formed continuously in the same reaction chamber at a temperature of 600° C.

However, a problem arising when such a film lamination sequence is realized is that the impurity is present not only in the doped Si film of the lower layer. Thus, the impurity also diffuses into the non-doped Si film of the upper layer, thereby creating a broad concentration distribution (concentration profile) of the impurity in the non-doped Si film.

It is an object of the present invention to provide a method for manufacturing a semiconductor device that includes a step of forming a silicon film on a substrate, and a substrate processing apparatus having a controller that performs control so as to form a silicon film on a substrate.

One aspect of the present invention relates to a method for manufacturing a semiconductor device, comprising the steps of: loading a substrate into a reaction chamber; supplying reactive gases into the reaction chamber and processing the substrate; and unloading the processed substrate from the reaction chamber, wherein the step of processing the substrate includes: a first film formation step of setting the substrate to a first temperature and forming a first silicon film including impurity atoms on the substrate and a second film formation step of setting the substrate to a second temperature, which is lower than the first temperature, and forming on the substrate a second silicon film that includes no impurity atoms or has an impurity concentration lower than that of the first silicon film on at least the first silicon film.

According to the one aspect of the present invention, it is possible to provide a method for manufacturing a semiconductor device by which a sharp impurity profile can be obtained when a first silicon film including impurity atoms is formed on the substrate and then a second silicon film that includes no impurity atoms or has an impurity concentration lower than that of the first silicon film is formed.

BRIEF DESCRIPTION OF THE DRAWINGS

FIG. 3 is an example of a laminated Si layer structure in accordance with the present invention;

DESCRIPTION OF THE PREFERRED EMBODIMENTS

The embodiments of the present invention will be described below with reference to the appended drawings.

(First Embodiment)

A substrate processing apparatus according to the present embodiment is configured as an example of a semiconductor production apparatus for use in the production of semiconductor devices.

In the explanation below, a case is considered in which a vertical apparatus for forming a film on a substrate is used as a substrate processing apparatus.

Figure 1:
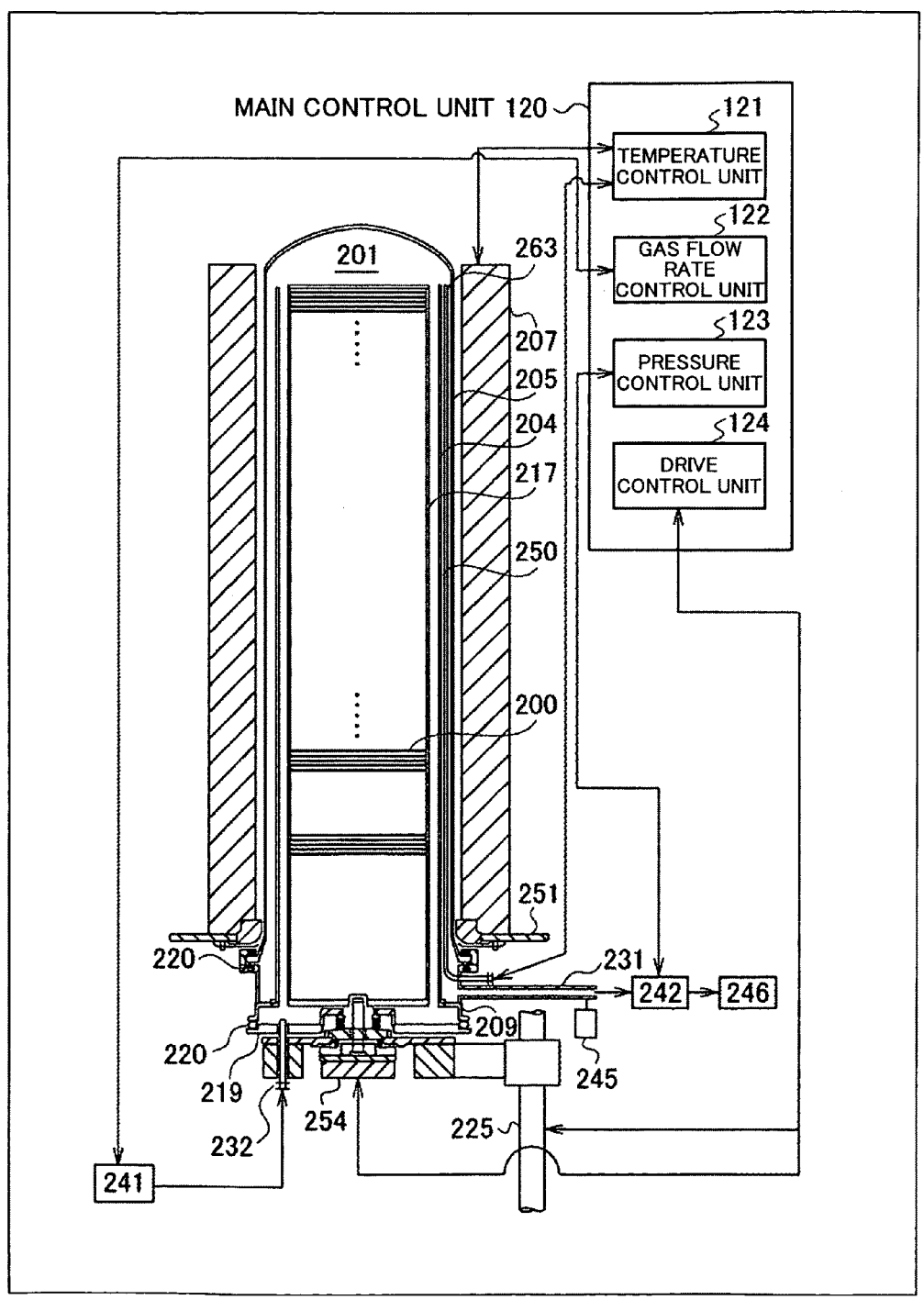
FIG. 1 is a schematic structural diagram of a CVD furnace for implementing the method for manufacturing a semiconductor device in accordance with the present invention.

FIG. 1 is a vertical sectional view of a low-pressure CVD processing furnace (LP-CVD film formation apparatus) as a vertical apparatus for implementing a method for manufacturing a semiconductor device of the present embodiment. The low-pressure CVD processing furnace has an outer tube (referred to hereinbelow as an outer tube 205) and an inner tube (referred to hereinbelow as an inner tube 204). The outer tube 205 is composed of a heat-resistant material such as quartz ($SiO_2$) and has a cylindrical shape with a closed upper end and open lower end. The inner tube 204 is disposed concentrically inside the outer tube 205 and has a cylindrical shape that is open at both the upper end and the lower end. The space between the outer tube 205 and the inner tube 204 constitutes a cylindrical space 250. The gas rising from the upper opening of the inner tube 204 passes through the cylindrical space 250 and is discharged from a discharge tube 231.

A manifold 209 composed, for example, of stainless steel is engaged with the lower ends of the outer tube 205 and inner tube 204, and the outer tube 205 and inner tube 204 are held in the manifold 209. The manifold 209 is fixed to the holding means (referred to hereinbelow as a heater base 251). Respective annular flanges are provided at the lower end portion of the outer tube 205 and end portion of the upper opening of the manifold 209, an air-tight member (referred to hereinbelow as an O-ring 220) is disposed between the flanges, and the two flanges are air-tightly sealed.

A disk-shaped lid (referred to hereinbelow as a seal cap 219) composed, for example, of stainless steel is detachably attached to enable air-tight sealing to the opening at the lower end of the manifold 209, the O-ring 220 being interposed therebetween. Gas supply tubes 232 are provided so as to pass through the seal cap 219. Processing gases are supplied from the gas supply tubes 232 into the outer tube 205. The gas supply tubes 232 are lined to a gas flow rate control means (referred to hereinbelow as a mass flow controller (MFC) 241), the MFC 241 is connected to a gas flow rate control unit 122, and the flow rate of the supplied gas can be controlled to a predetermined value.

A gas discharge tube 231 linked to a pressure regulator (for example, APC, $N_2$ ballast controller; referred to hereinbelow as APC 242) and a discharge device (referred to hereinbelow as a vacuum pump 246) is connected to the upper portion of the manifold 209, the gas flowing in the cylindrical space 250 between the outer tube 205 and inner tube 204 is discharged through the gas discharge tube, and the pressure inside the outer tube 205 is controlled by the APC 242. As a result, this pressure is detected by a pressure detection means (referred to hereinbelow as a pressure sensor 245) and controlled by the pressure control unit 123 to obtain a low-pressure atmosphere of a predetermined pressure.

A rotation means (referred to hereinbelow as a rotation shaft 254) is linked to the seal cap 219, and a substrate holding means (referred to hereinbelow as a boat 217) and a substrate (referred to hereinbelow as a wafer 200) that is held on the boat 217 are rotated by the rotation shaft 254. The seal cap 219 is connected to an elevation means (referred to hereinbelow as a boat elevator 225) and the boat 217 can be raised and lowered. The rotation shaft 254 and boat elevator 225 are controlled by the drive control unit 124 to ensure the movement thereof at a predetermined speed.

A heating means (referred to hereinbelow as a heater 207) is disposed concentrically on the outer periphery of the outer tube 205. The temperature inside the outer tube 205 is detected by a temperature detection means (referred to hereinbelow as thermocouple 263) and the heater 207 is controlled by a temperature control unit 121 to obtain a predetermined processing temperature inside the outer tube.

An example of a low-pressure CVD processing method carried out using the processing furnace shown in FIG. 1 will be explained below. Initially, the boat 217 is lowered by the boat elevator 225. A plurality of wafers 200 are held in the boat 217. The temperature inside the outer tube 205 is then raised to a predetermined processing temperature by heating with the heater 207. The inside the outer tube 205 is filled in advance with an inactive gas by the MFC 241 connected to the gas supply tube 232, the boat 217 is raised by the boat elevator 225 into the outer tube 205, and the temperature inside the outer tube 205 is maintained at the predetermined processing temperature. The inside of the outer rube 205 is evacuated to a predetermined degree of vacuum, and the boat 217 and the wafers 200 held by the boat 217 are rotated by the rotation shaft 254. At the same time, a gas for processing is supplied from the gas supply tube 232. The supplied gas rises inside the outer tube 205 and is uniformly supplied to the wafers 200.

The pressure inside the outer tube 205 in the course of the low-pressure CVD processing is controlled by APC 242 so as to discharge the gas via the discharge tube 231 and obtain the predetermined degree of vacuum, and the low-pressure CVD processing is conducted for a predetermined time.

Once the low-pressure CVD processing is completed, a transition has to be made to low-pressure CVD processing of the next load of wafers 200. Thus, the gas inside the outer tube 205 is replaced with inactive gas, the pressure is returned to the normal pressure, the boat 217 is lowered by the boat elevator 225, and the boat 217 and the processed wafers 200 are taken out of the outer rube 205. The processed wafers 200 located on the boat 217 that has been taken out of the outer tube 205 are replaced with unprocessed wafers 200, the boat is again raised inside the outer tube 205 in the same manner as described above, and the low-pressure CVD processing is implemented.

Figure 2:
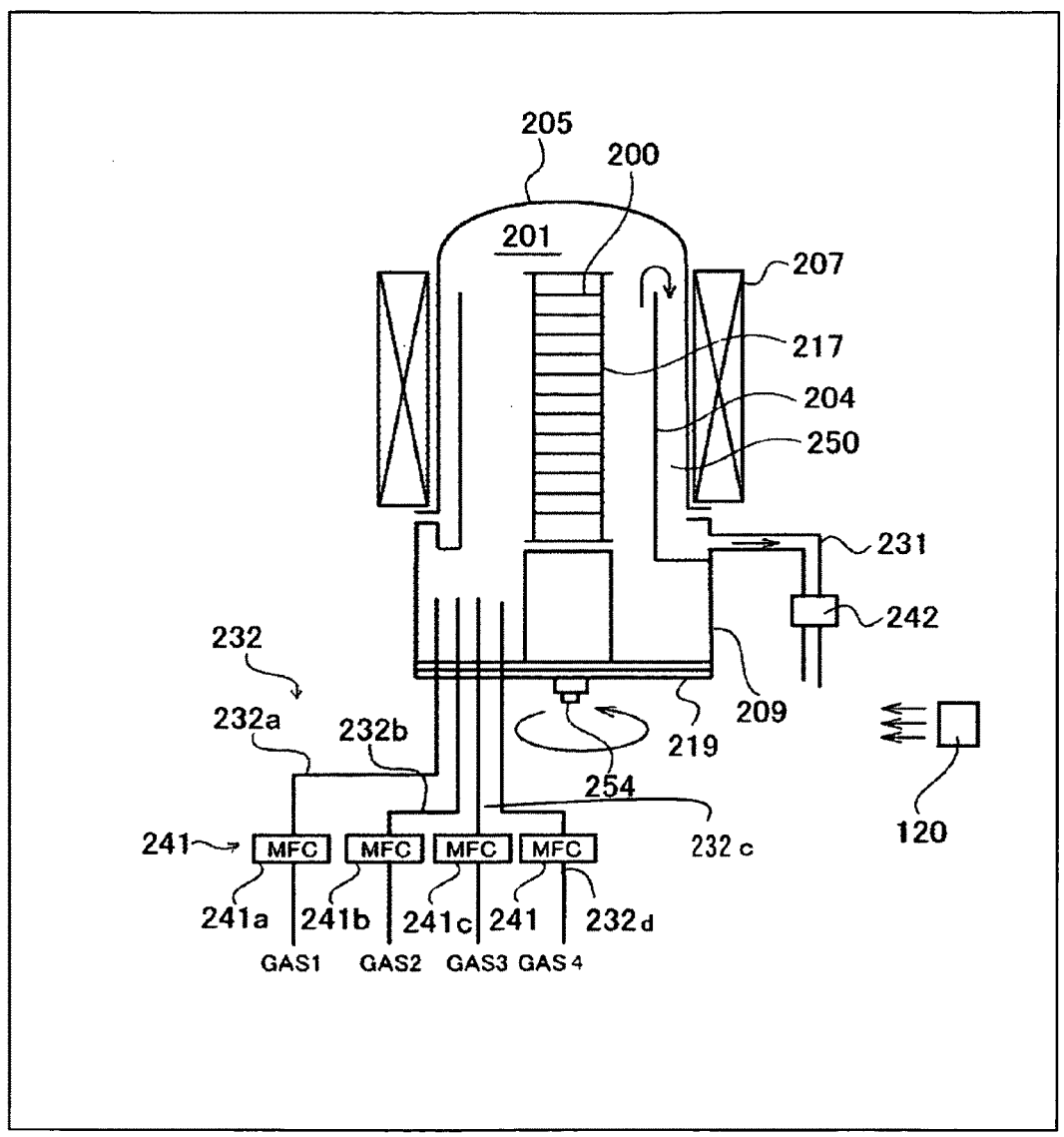
FIG. 2 is a vertical sectional view of the low-pressure CVD processing furnace of an embodiment.

FIG. 2 is a simplified view of the above-described low-pressure CVD processing furnace designed to facilitate the explanation of the method for manufacturing a semiconductor device of the present embodiment. The method is explained below again in a simple manner with reference to FIG. 2, part thereof repeating the explanation relating to FIG. 1.

The outer tube 205 is provided inside the heater 207. The inner tube 204 constituting the reaction chamber 201 is arranged inside the outer tube 205. The outer tube 205 and inner tube 204 are installed on the manifold 209 and the lower end of the manifold 209 is air-tightly sealed by the seal cap 219. The boat 217 is installed on the seal cap 219 and inserted into the inner tube 204. The wafers 200 that are to be processed are loaded horizontally in a multistage manner in the boat 217. The boat 217 can be rotated by the rotation shaft 254 in the direction shown by the arrow.

A plurality (in this case, four) of gas supply tubes 232a to 232d communicate with respective locations in the lower portion of the inner tube 204 of the seal cap 219, and different reactive gases GAS1 to GAS4 can be supplied into the reaction chamber 201. The reaction gas GAS1 is a gas including silicon atoms, for example, $SiH_4$ (monosilane) gas. GAS2 is a gas including phosphorus atoms that are impurity atoms, for example, $PH_3$ (phosphine) gas. GAS3 is a gas that includes silicon atoms and has a thermal decomposition temperature lower than that of the GAS1, for example, $Si_2H_6$ (disilane) gas. The GAS4 is an inactive gas, for example $N_2$ (nitrogen) gas. MFC 241a to 241d that control a gas flow rate are provided in gas supply tubes 232a to 232d, respectively.

The discharge tube 231 is connected to the manifold 209 so as to communicate with the lower end of the cylindrical space 250 formed between the outer tube 205 and inner tube 204. The pressure regulator 242 that controls the pressure inside the reaction chamber 201 is provided in the discharge tube 231.

The boat 217 is lowered by the boat elevator (not shown in the figure), the seal cap 219 being interposed therebetween. The wafers 200 are loaded in the boat 217, and the boat 217 is inserted in the inner tube 204 by the boat elevator. The seal cap 219 completely seals the lower end of the manifold 209, and the inside of the outer tube 205 (the inside of the reaction chamber 201) is then evacuated. The MFC 241, pressure regulator 242, and rotation shaft 254 are controlled by a main control unit 120.

Figure 4:
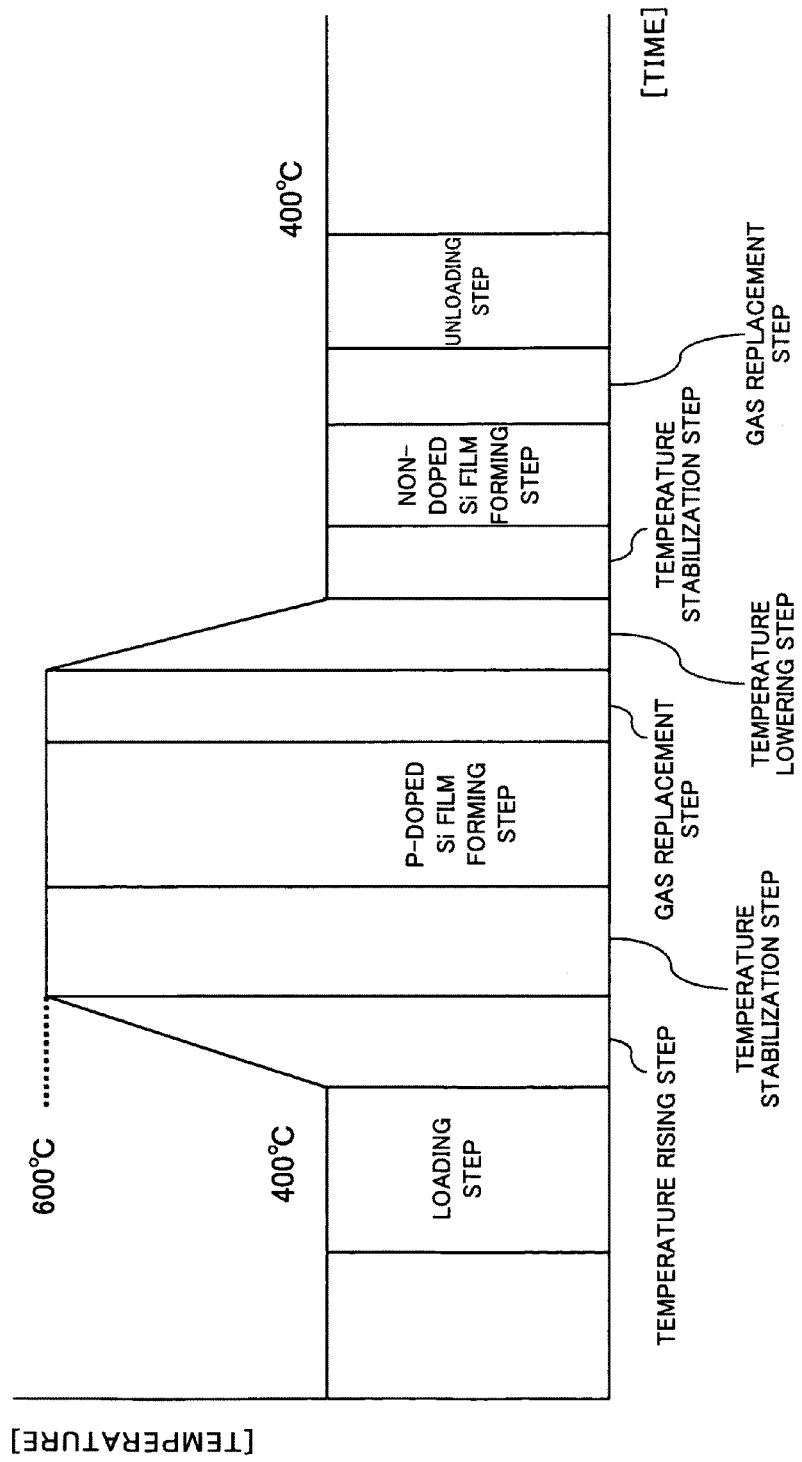
FIG. 4 is a sequence diagram for forming a laminated film of a P-doped Si film and a non-doped Si film in the first embodiment of the invention.

FIG. 3B shows a laminated film structure of a P-doped Si film as an N-type semiconductor film and a non-doped Si film as an i-type semiconductor film to which the present embodiment is applied. FIG. 4 shows a film formation sequence.

The wafers are heated to a temperature of 600° C., which is a film formation temperature of the P-doped Si film, inside the reaction chamber and the P-doped Si film is formed on the wafer surface by supplying the $SiH_4$ gas and $PH_3$ gas. The $SiH_4$ gas and $PH_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of P into the non-doped Si film and realize a sharp impurity profile in the film. In this case, the temperature is preferably lowered to 400° C. or a lower temperature. As a result, the auto-doping of P into the non-doped Si film can be further inhibited and an even sharper impurity profile in the film can be realized.

After a large number of wafers 200 have been loaded into the boat 217 with a wafer loading mechanism (not shown in the figure) under the control of the main control unit 120, the boat 217 is lifted and loaded into the reaction chamber 201 (loading step).

Upon completion of the loading step, the temperature inside the reaction chamber 201 is raised by the heater 207 to a first film formation temperature as a first temperature (temperature rising step). For example, the temperature is raised to 600° C. Upon completion of the temperature rising step, fine regulation of the temperature is performed with the heater 207, and the reaction chamber 201 is stabilized at a first film formation temperature (first temperature stabilization step).

Once the temperature inside the reaction chamber has been stabilized, the gases are discharged from the gas discharge tube 231, while the reactive gases are being supplied from the gas supply tubes 232 into the reactive chamber 201. The inside of the inner tube 204 is heated by the heater 207 to the first film formation temperature and a film is formed on the surface of wafers 200 (first film formation step).

In this case, where a gas including silicon atoms (for example, $SiH_4$) is supplied as GAS1 from the gas supply tube 232a to the wafers 200, a gas including phosphorus atoms (for example, $PH_3$) that are impurity atoms is supplied as GAS2 from the gas supply tube 232b, and the reaction chamber 201 is heated to and maintained at, for example, at 600° C., which is the film formation temperature of a P-doped Si film, a silicon film including phosphorus atoms that are impurity atoms is formed on the wafers 200.

The chemical reaction formula can be represented, for example, as follows: $SiH_4+PH_3 \rightarrow$ P-doped Si film.

The gases are then discharged from the gas discharge tube 231, while an inactive gas (for example, $N_2$) is being supplied as GAS4 from the gas supply tube 232d, whereby the reactive gases that have been used in the first film formation step are discharged from inside the reaction chamber 201 (first gas replacement step).

The temperature inside the reaction chamber 201 is then lowered with the heater 207 from the film formation temperature to a temperature serving as a second temperature (temperature lowering step). At this time, the temperature is lowered to a level at which the diffusion of phosphorus atoms contained in the reactive gases that have been used in the first film formation step is inhibited. For example, the temperature is lowered to 400° C.

The gas replacement step and temperature lowering step may be performed simultaneously. Where they are performed simultaneously, the throughput can be further increased.

Providing the first gas replacement step is advantageous in terms of facilitating the control of thickness and quality of the first silicon film, but this step may be omitted. In a process including no first gas replacement step, the throughput can be increased.

Fine regulation of temperature is then performed with the heater 207 to stabilize the reaction chamber 201 at a second film formation temperature (second temperature stabilization step).

The gases are then discharged from the gas discharge tube 231, while supplying the reactive gases from the gas supply tubes 232 into the reaction chamber 201. The inside of the inner tube 204 is heated with the heater 207 and a film is formed on the surface of wafers 200 (second film formation step).

In this case, where a gas including silicon atoms (for example, $Si_2H_6$) is supplied as GAS3 from the gas supply tube 232c to the wafer 200 and the reaction chamber 201 is heated to and maintained at a temperature of, for example, 400° C., which is the formation temperature of a non-doped Si film, a non-doped silicon film is formed on the wafers 200. Thus, a second silicon film is formed that contains no impurities or has an impurity concentration lower than that of the first silicon film.

The chemical reaction formula can be represented, for example, as follows: $Si_2H_6 \rightarrow$ non-doped Si film.

Upon completion of film formation, the inactive gas is supplied as GAS4 from the gas supply tube 232d, the atmosphere inside the outer tube 205 and inner tube 204 is replaced with the inactive gas, and the normal pressure is restored (second gas replacement step).

The boat 217 is then lowered, and the wafers 200 subjected to the film formation process are taken out of the boat 217 (unloading step).

Where the films are thus formed on the substrate, the impurity profile in the non-doped Si film layer can be prevented from broadening. Thus, a sharp impurity profile in the film can be realized because the P concentration decreases abruptly in the vicinity of interface with the base material.

Where the films are formed on the substrate by a non-plasma processing in this manner, an expensive plasma generator for a plasma processing can be eliminated.

The range of preferred conditions in the present embodiment is described below.

$SiH_4$ (monosilane) is an example of the gas including silicon atoms that is used as GAS1.

$PH_3$ (phosphine) is an example of gas including phosphorus atoms (impurity atoms) that is used as GAS2.

$Si_2H_6$ (disilane) is an example of the gas including silicon atoms that is used as GAS3.

Where a P-doped Si film is formed as an N-type semiconductor film by using a gas including phosphorus atoms and a gas including silicon atoms, in a film formation process that seeks to ensure a film uniformity within ±5% and an impurity concentration of greater than 1E18 atoms/cc and equal to or less than 1E21 atoms/cc, the preferred temperature range for effective formation of the P-doped Si film is 530-600° C. (equal to or higher than 530° C. and equal to or lower than 600° C.). Where a non-doped Si film is formed as an i-type semiconductor film on the P-doped Si film by using $Si_2H_6$ gas as reactive gas, in a film formation process that seeks to ensure a film uniformity within ±5% and an impurity concentration of equal to or less than 1E18 atoms/cc, the preferred temperature range for effective formation of the non-doped Si film is 380-450° C. (equal to or higher 380° C. and equal to or lower than 450° C.).

By providing a difference of equal to or greater than 100° C. between the film formation temperature (first temperature) during the formation of the P-doped Si film and the film formation temperature (second temperature) during the formation of the non-doped Si film, it is possible to inhibit further the broadening of the impurity concentration distribution (concentration profile) into the non-doped Si film.

In a case where a P-doped Si film is formed using a phosphorus atom-containing gas and a silicon atom-containing gas, the preferred pressure range is 0.1 to 10 Torr (13.3 to 1330 Pa (equal to or higher than 13.3 and equal to or lower than 1330 Pa)).

In a case where the non-doped Si film is formed on the P-doped Si film by using $Si_2H_6$ gas as a reactive gas, the preferred pressure range is 0.1 to 10 Torr (13.3 to 1330 Pa (equal to or higher than 13.3 and equal to or lower than 1330 Pa)).

The control of P concentration in the film is performed by regulating the gas flow rate and pressure by controlling the MFC 241 and pressure regulator 242 with the main control device 120.

COMPARATIVE EXAMPLE

Figure 17:
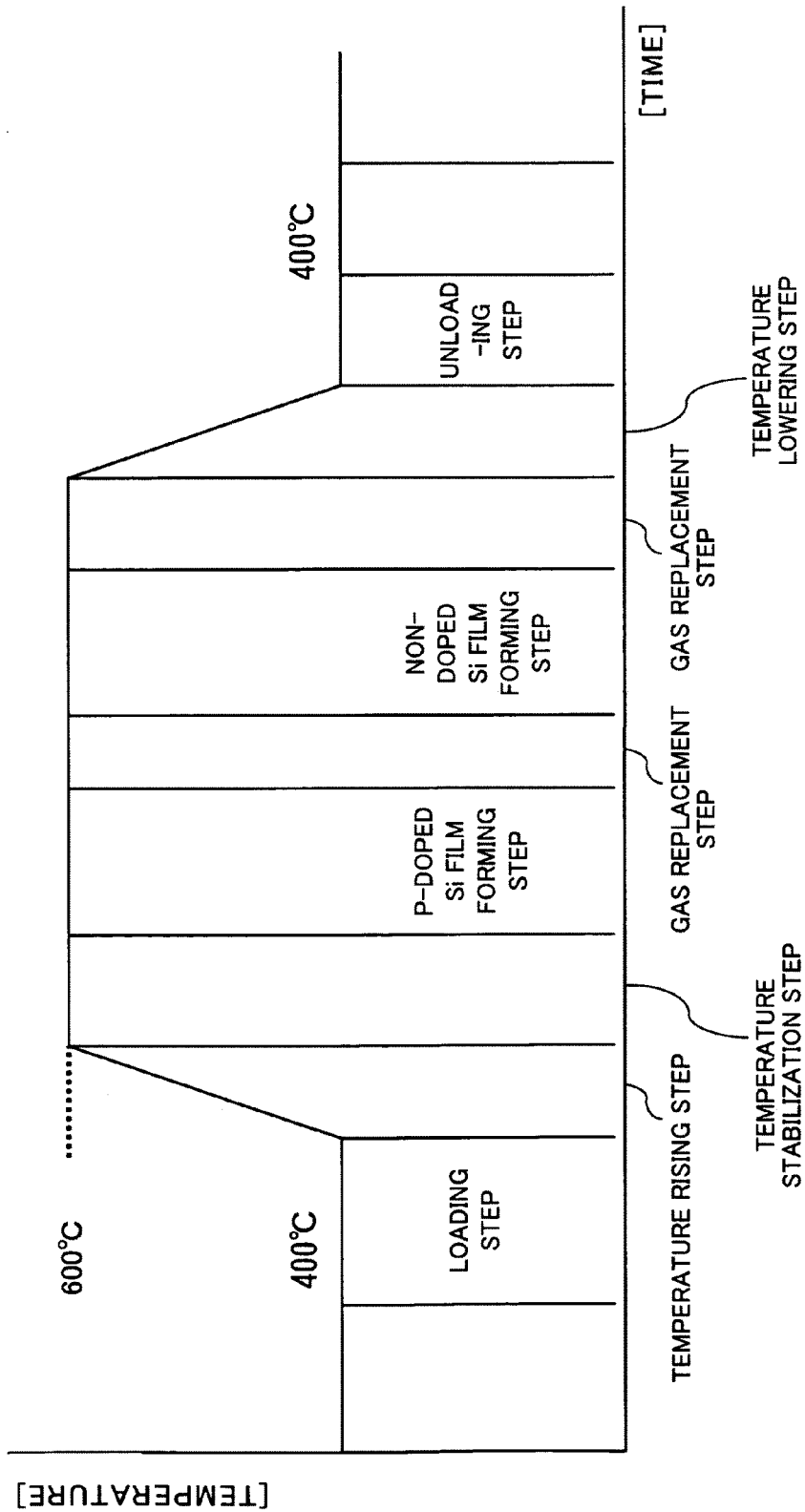
FIG. 17 is a comparative sequence diagram corresponding to the sequence diagram for forming a laminated film of a P-doped Si film and a non-doped Si film in the first embodiment of the invention.

Film formation with a sharp impurity profile can be realized by forming a film substrate in the above-described manner. The reasons why such a sharp impurity profile cannot be realized with another film formation sequence shown in FIG. 17 will be described below.

Wafers are heated to and maintained at a temperature, for example, of 600° C., which is a film formation temperature for a P-doped Si film, inside the reaction chamber, and a P-doped Si film is formed on the substrate surface by supplying the $SiH_4$ gas and $PH_3$ gas. The $SiH_4$ gas and $PH_3$ gas are then discharged from the reaction chamber. Then, only the $SiH_4$ gas is supplied into the reaction chamber and a non-doped Si film is formed on the wafers.

In a case where the non-doped Si film is laminated and continuously formed on the P-doped Si film, for example, in a case where the P-doped Si film is formed at a temperature of 600° C. and then the inside of the same reaction chamber is continuously heated to and maintained at 600° C. and a non-doped Si film is formed, a P-doped Si film including a large amount of P is formed on the inner wall surface of the reaction chamber, and even after the supply of the $PH_3$ gas is stopped and the gas is discharged, the P diffuses outwardly from the wall surface and P is present at all times inside the reaction chamber. As a result, even when the non-doped Si film is formed in the next step by supplying only the $SiH_4$ gas, this outwardly diffused P penetrates into the film and a P-doped Si film is formed, although the concentration of phosphorus therein is low.

As a result of such a reaction, the profile of P doped amount in the laminated film composed of the P-doped Si film and non-doped Si film on the wafer is apparently a broad profile in which the concentration of P in the non-doped Si film layer in the vicinity of the interface with the P-doped Si film serving as the base layer therefor decreases gradually, rather than drops rapidly.

Typically, when a non-doped Si film is formed, $SiH_4$ (monosilane) gas, $Si_2H_6$ (disilane) gas, or $Si_2H_2Cl_2$ (dichlorosilane) gas is used. A film thickness of 50 nm to 100 nm (equal to or more than 50 nm and equal to or less than 100 nm) is required.

In order to form a film, while maintaining the film quality, a film formation time of about 30 min to 3 h is required. Therefore, a film formation rate of equal to or greater than about 0.5 nm/min is effectively required.

It is generally known that in order to decompose the $SiH_4$ (monosilane) gas, $Si_2H_6$ (disilane) gas, or $Si_2H_2Cl_2$ (dichlorosilane) gas with thermal energy and attain a film formation rate of equal to or greater than about 0.5 nm/min, the following effective thermal decomposition temperature (film formation temperature) is necessary.

$SiH_4$ (monosilane): 500° C. or higher;
$Si_2H_6$ (disilane): 380° C. or higher; and
$Si_2H_2Cl_2$ (dichlorosilane): 700° C. or higher.

The main reason why the impurity profile changes into a broad profile when the non-doped Si film is formed is apparently in auto-doping caused by precipitation of impurities from the periphery, and the amount of auto-doping depends on the reaction chamber temperature.

In a perfect case, where the non-doped Si film is formed in a state in which the reaction chamber temperature has been unrestrictedly decreased, the auto-doping decreases to a level at which it can be ignored. However, the effective lower limit temperature at which the non-doped Si film can be formed is about 380-450° C. (equal to or higher than 380° C. and equal to or lower than 450° C.), that is, within a range in which the $Si_2H_6$ (disilane) gas is used. Accordingly, the sharpest impurity profile can be formed by forming the non-doped Si film, while inhibiting the precipitation of impurities from the inner wall surface of the reaction chamber in a state in which the reaction chamber temperature is reduced to a lowest possible temperature at which the formation of the non-doped Si film still can be realized.

(Effect)

One or several below-described effects are attained with the embodiment described hereinabove in detail.

(1) By setting the substrate to a first temperature, forming a first silicon film including impurity atoms on the substrate, and then decreasing the reaction chamber temperature to a second temperature, it is possible to reduce the amount of impurities that diffuse outwardly from the inner wall surface of the reaction chamber to a level that can be ignored and to form a second silicon film that includes no impurity atoms and has a sharp impurity profile in the film or has an impurity concentration lower than that in the first silicon film.

(2) By decreasing the reaction chamber temperature after the formation of the silicon film including impurity atoms has been completed, it is possible to reduce the amount of impurities that diffuse outwardly from the inner wall surface of the reaction chamber to a level that can be ignored. Furthermore, by supplying into the reaction chamber a silicon atom-containing gas that has a thermal decomposition temperature lower than that of the silicon atom-containing gas that has been used to form the aforementioned silicon film including the impurity atoms, it is possible to form a non-doped Si film on the substrate in a state in which the inclusion of impurities is made even more difficult.

(3) By supplying the $SiH_4$ gas and gas that includes P atoms as impurities, completing the formation of the P-doped Si film, and then decreasing the reaction chamber temperature to a temperature equal to or lower than 450° C., it is possible to reduce the amount of impurities that diffuse outwardly from the inner wall surface of the reaction chamber to a level that can be ignored. Furthermore, by supplying $Si_2H_6$ gas, which has a thermal decomposition temperature lower and reactivity higher (self decomposes easier) than the $SiH_4$ gas, it is possible to form a non-doped Si film on the substrate in a state in which the inclusion of impurities is made even more difficult. In particular, by lowering the reaction chamber temperature to a temperature equal to or lower than 400° C., it is possible to reduce the amount of impurities that diffuse outwardly from the inner wall surface of the reaction chamber to an even lower level that can be ignored.

(4) When a silicon film including impurity atoms is formed at least on the wafers, the silicon film including the impurity atoms is also formed on the inner wall surface of the reaction chamber, and when the non-doped silicon film is thereafter formed at least on the silicon film including the impurity atoms on the substrate in a continuous manner in the same reaction chamber, the non-doped silicon film is also formed on the silicon film including the impurity atoms that is located on the inner wall surface of the reaction chamber. As a result, the non-doped silicon film covers the impurity atoms on the inner wall surface of the reaction chamber, and the outward diffusion of the impurities from the doped silicon film located on the inner wall surface of the reaction chamber can be inhibited in the subsequent film formation step implemented in the same reaction chamber.

(5) By forming the non-doped Si film also on the inner wall surface of the reaction chamber when the non-doped Si film is formed on the substrates, it is possible to coat the non-doped Si film on the P-doped Si film that has been formed therebelow and inhibit the outward diffusion of P from the P-doped Si film located on the inner wall surface of the reaction chamber in the subsequent film formation step.

(6) Where the impurity-doped Si film and non-doped Si film are formed discontinuously, the efficiency is poor and throughput is degraded. Further, where the impurity-doped Si film is exposed to an oxygen-containing atmosphere such as air after the film has been formed, for example, when the films are formed in separate substrate processing apparatuses, a structure is obtained in which a natural oxidation film is sandwiched at the interface between the impurity-doped Si film and non-doped Si film. The demerit of the structure in which such natural oxidation film is present is that where the laminated structure is used as a semiconductor device such as a capacitor, a spread of electric characteristics, such as the occurrence diffusion current or drift current, occurs. However, because a Si film containing no impurity atoms or having an impurity concentration lower than that of the impurity-doped Si film can be formed at least on the impurity-doped Si film in a continuous manner in the same reaction chamber after the impurity-doped Si film has been formed, it is possible to obtain a highly clean interface in the laminated structure, while maintaining high productivity.

(7) Where the films are formed on the substrate by a non-plasma processing, an expensive plasma generator for a plasma processing can be eliminated.

(Second Embodiment)

In the present embodiment, by contrast with the first embodiment, GAS2 is a gas including boron atoms. Thus, in the present embodiment, a gas including boron atoms, for example, $BCl_3$ (boron trichloride) is used as GAS2.

Other features of the processing furnace of the present embodiment are similar to those of the first embodiment.

Figure 5:
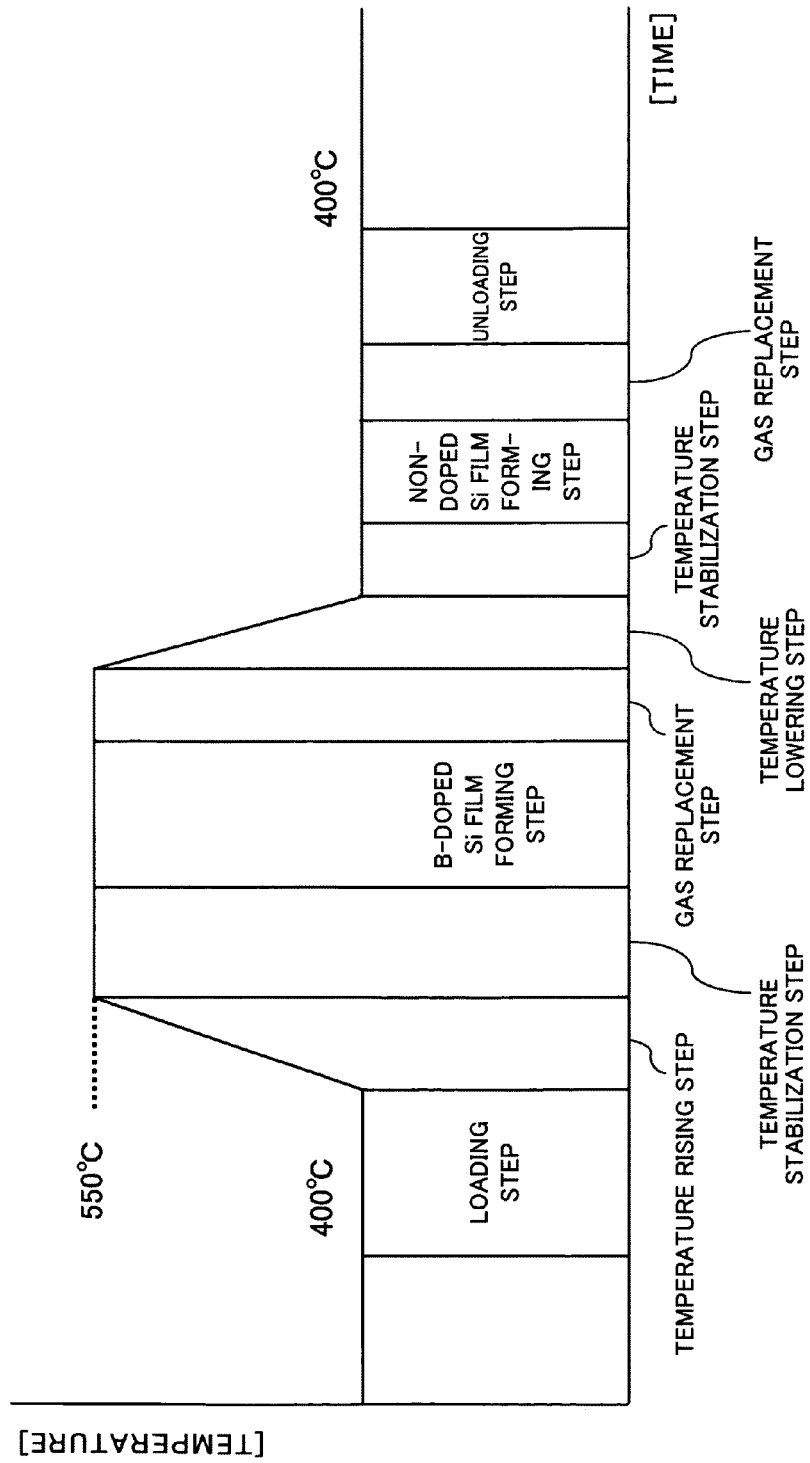
FIG. 5 is a sequence diagram for forming a laminated film of a B-doped Si film and a non-doped Si film in the second embodiment of the invention.

FIG. 3A shows a laminated film structure of a B-doped Si film as a P-type semiconductor film and a non-doped Si film as an i-type semiconductor film to which the present embodiment is applied. FIG. 5 shows a film formation sequence.

The wafers are heated to a temperature of 550° C., which is a film formation temperature of the B-doped Si film, inside the reaction chamber and the B-doped Si film is formed on the wafer surface by supplying the $SiH_4$ gas and $BCl_3$ gas. The $SiH_4$ gas and $BCl_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of B into the non-doped Si film and realize a sharp impurity profile in the film. In this case, the temperature is preferably lowered to 400° C. or a lower temperature. As a result, the auto-doping of B into the non-doped Si film can be further inhibited and an even sharper impurity profile in the film can be realized.

After a large number of wafers 200 have been loaded into the boat 217 with a wafer loading mechanism (not shown in the figure) under the control of the main control unit 120, the boat 217 is lifted and loaded into the reaction chamber 201 (loading step).

Upon completion of the loading step, the temperature inside the reaction chamber 201 is raised by the heater 207 to a first film formation temperature as a first temperature (temperature rising step). For example, the temperature is raised to 550° C. Upon completion of the temperature rising step, fine regulation of the temperature is performed with the heater 207, and the reaction chamber 201 is stabilized at a first film formation temperature (first temperature stabilization step).

Once the temperature inside the reaction chamber has been stabilized, gases are discharged from the gas discharge tube 231, while the reactive gases are being supplied from the gas supply tubes 232 into the reactive chamber 201. The inside of the inner tube 204 is heated by the heater 207 to the first film formation temperature and a film is formed on the surface of wafers 200 (first film formation step).

In this case, where a gas including silicon atoms (for example, $SiH_4$) is supplied as GAS1 from the gas supply tube 232a to the wafers 200, a gas including boron atoms (for example, $BCl_3$) that are impurity atoms is supplied as GAS2 from the gas supply tube 232b, and the reaction chamber 201 is heated to and maintained at, for example, at 550° C., which is the film formation temperature of a B-doped Si film, a silicon film including boron atoms that are impurity atoms is formed on the wafers 200.

The chemical reaction formula can be represented, for example, as follows: $SiH_4 + BCl_3 \rightarrow$ B-doped Si film.

Gases are then discharged from the gas discharge tube 231, while an inactive gas (for example, $N_2$) is being supplied as GAS4 from the gas supply tube 232d, whereby the reactive gases that have been used in the first film formation step are discharged from inside the reaction chamber 201 (first gas replacement step).

The temperature inside the reaction chamber 201 is then lowered with the heater 207 from the film formation temperature (temperature lowering step). At this time, the temperature is lowered to a level at which the diffusion of boron atoms contained in the reactive gases that have been used in the first film formation step is inhibited. For example, the temperature is lowered to 400° C.

The gas replacement step and temperature lowering step may be performed simultaneously. Where they are performed simultaneously, the throughput can be further increased.

Providing the first gas replacement step is advantageous in terms of facilitating the control of thickness and quality of the first silicon film, but this step may be omitted. In a process including no first gas replacement step, the throughput can be increased.

Fine regulation of temperature is then performed with the heater 207 to stabilize the reaction chamber 201 at a second film formation temperature (second temperature stabilization step).

The gases are then discharged from the gas discharge tube 231, while supplying the reactive gases from the gas supply tubes 232 into the reaction chamber 201. The inside of the inner tube 204 is heated with the heater 207 and a film is formed on the surface of wafers 200 (second film formation step).

In this case, where a gas including silicon atoms (for example, $Si_2H_6$) is supplied as GAS3 from the gas supply tube 232c to the wafer 200 and the reaction chamber 201 is heated to and maintained at a temperature of, for example, 400° C., which is the formation temperature of a non-doped Si film, a non-doped silicon film is formed on the wafers 200. Thus, a second silicon film is formed that contains no impurities or has an impurity concentration lower than that of the first silicon film.

The chemical reaction formula can be represented, for example, as follows: $Si_2H_6 \rightarrow$ non-doped Si film.

Upon completion of film formation, the inactive gas is supplied as GAS4 from the gas supply tube 232d, the atmosphere inside the outer tube 205 and inner tube 204 is replaced with the inactive gas, and the normal pressure is restored (second gas replacement step).

The boat 217 is then lowered, and the wafers 200 subjected to the film formation process are taken out of the boat 217 (unloading step).

Where the films are thus formed on the substrate, the impurity profile in the non-doped Si film layer can be prevented from broadening. Thus, a sharp impurity profile in the film can be realized because B concentration decreases abruptly in the vicinity of interface with the base material.

Where the films are formed on the substrate by a non-plasma processing in this manner, an expensive plasma generator for a plasma processing can be eliminated.

The range of preferred conditions in the present embodiment is described below.

$SiH_4$ (monosilane) is an example of the gas including silicon atoms that is used as GAS1.

$BCl_3$ (borontrichloride) and $B_2H_6$ (diborane) are examples of the gas including boron atoms (impurity atoms) that is used as GAS2.

$Si_2H_6$ (disilane) is an example of the gas including silicon atoms that is used as GAS3.

Where a B-doped Si film is formed as a P-type semiconductor film by using a gas including boron atoms and a gas including silicon atoms, in a film formation process that seeks to ensure a film uniformity within ±5% and an impurity concentration of greater than 1E18 atoms/cc and equal to or less than 1E21 atoms/cc, the preferred temperature range for effective formation of the B-doped Si film is 450-550° C. (equal to or higher than 450° C. and equal to or lower than 550° C.).

Where a non-doped Si film is formed as an i-type semiconductor film on the B-doped Si film by using $Si_2H_6$ gas as reactive gas, in a film formation process that seeks to ensure a film uniformity within ±5% and an impurity concentration of equal to or less than 1E18 atoms/cc, the preferred temperature range for effective formation of the non-doped Si film is 380-450° C. (equal to or higher than 380° C. and equal to or lower than 450° C.).

By providing a difference of equal to or greater than 50° C. between the film formation temperature (first temperature) during the formation of the B-doped Si film and the film formation temperature (second temperature) during the formation of the non-doped Si film, it is possible to inhibit further the broadening of the impurity concentration distribution (concentration profile) into the non-doped Si film.

In a case where a B-doped Si film is formed using a gas including boron atoms and a gas including silicon atoms, the preferred pressure range is 0.1 to 10 Torr (13.3 to 1330 Pa (equal to or higher than 13.3 Pa and equal to or lower than 1330 Pa)).

In a case where the non-doped Si film is formed on the B-doped Si film by using $Si_2H_6$ gas as a reactive gas, the preferred pressure range is 0.1 to 10 Torr (13.3 to 1330 Pa (equal to or higher than 13.3 Pa and equal to or lower than 1330 Pa)).

The control of B concentration in the film is performed by regulating the gas flow rate and pressure by controlling the MFC 241 and pressure regulator 242 with the main control device 120.

COMPARATIVE EXAMPLE

Figure 13:
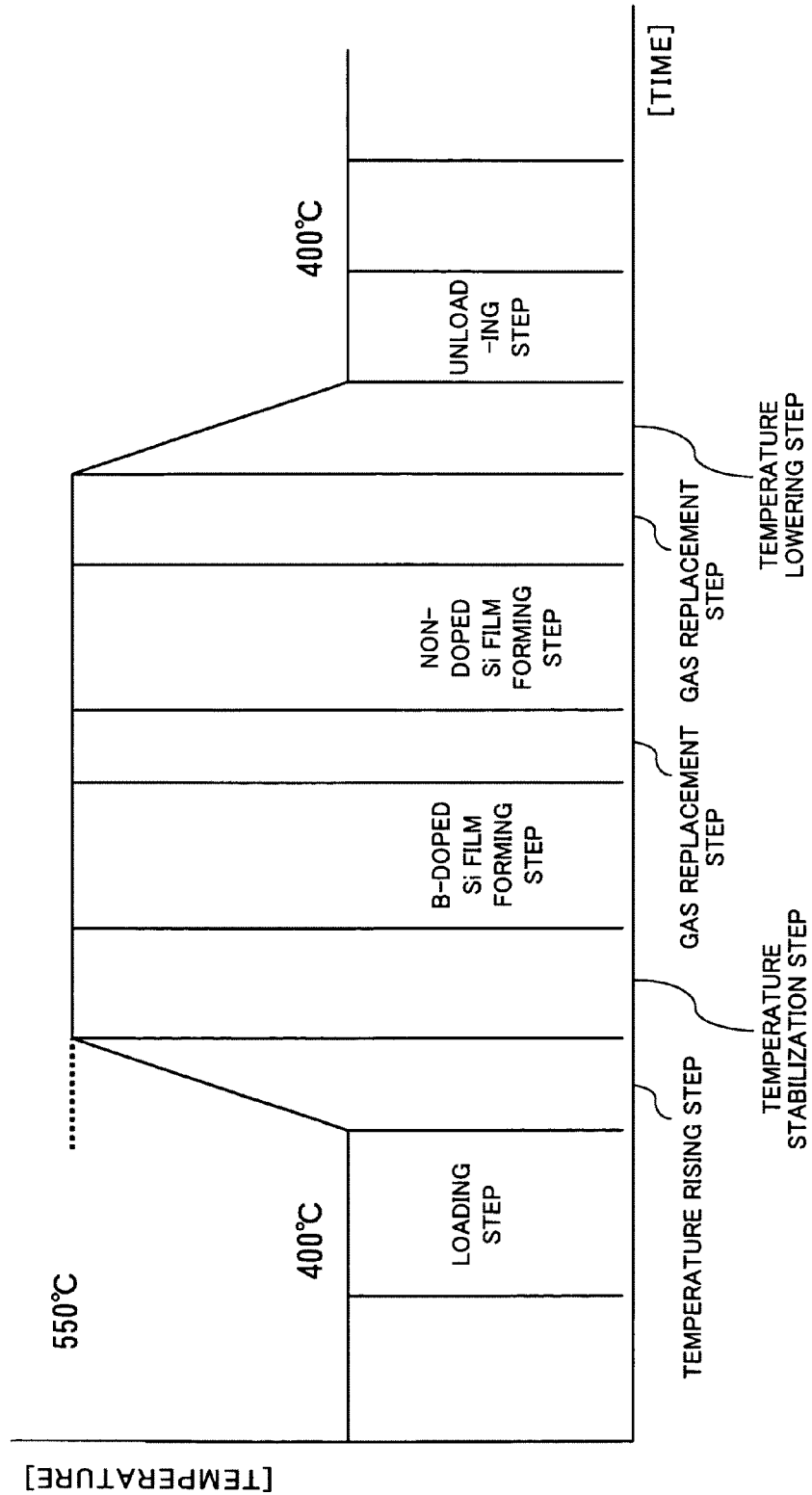
FIG. 13 is a comparative sequence diagram corresponding to the sequence diagram for forming a laminated film of a B-doped Si film and a non-doped Si film in the second embodiment of the invention.

Film formation with a sharp impurity profile can be realized by forming a film substrate in the above-described manner. The reasons why such an impurity concentration distribution cannot be realized with another film formation sequence shown in FIG. 13 will be described below.

Wafers are heated to and maintained at a temperature, for example, of 550° C., which is a film formation temperature for a B-doped Si film, inside the reaction chamber, and a B-doped Si film is formed on the substrate surface by supplying the $SiH_4$ gas and $BCl_3$ gas. The $SiH_4$ gas and $BCl_3$ gas are then discharged from the reaction chamber. Then, only the $SiH_4$ gas is supplied into the reaction chamber and a non-doped Si film is formed on the wafers.

In a case where the non-doped Si film is laminated and continuously formed on the B-doped Si film, for example, in a case where the B-doped Si film is formed at a temperature of 550° C. and then the inside of the same reaction chamber is continuously heated to and maintained at 550° C. and a non-doped Si film is formed, a B-doped Si film including a large amount of B is formed on the inner wall surface of the reaction chamber, and even after the supply of the $BCl_3$ gas is stopped and the gas is discharged, the B diffuses outwardly from the wall surface and B is present at all times inside the reaction chamber. As a result, even when the non-doped Si film is formed in the next step by supplying only the $SiH_4$ gas, this outwardly diffused B penetrates into the film and a B-doped Si film is formed, although the concentration of boron therein is low.

As a result of such a reaction, the profile of B doped amount in the laminated film composed of the B-doped Si film and non-doped Si film on the wafer is apparently a broad profile in which the concentration of B in the non-doped Si film layer in the vicinity of the interface with the B-doped Si film serving as the base layer therefor decreases gradually, rather than drops rapidly.

(Effects)

With the above-described embodiment, one or several below-described effects are attained in addition to the effects described with reference to the first embodiment.

(1) By using a silicon-containing gas and gas that includes B atoms as impurities, completing the formation of the B-doped Si film, and then decreasing the reaction chamber temperature to a temperature of equal to or lower than 450° C., it is possible to reduce the amount of B that diffuses outwardly from the inner wall surface of the reaction chamber to a level that can be ignored. Furthermore, by supplying $Si_2H_6$ gas, which has a thermal decomposition temperature lower and reactivity higher (self decomposes easier) than the $SiH_4$ gas, it is possible to form a non-doped Si film on the substrate in a state in which the inclusion of B is difficult. In particular, by lowering the reaction chamber temperature to a temperature equal to or lower than 400° C, it is possible to reduce the amount of B that diffuse outwardly from the inner wall surface of the reaction chamber to an even lower level that can be ignored.

(2) By also forming the non-doped Si film on the inner wall surface of the reaction chamber when the non-doped Si film is formed on the wafers, it is possible to coat the non-doped Si film on the B-doped Si film that has been formed therebelow and inhibit the outward diffusion of B from the B-doped Si film located on the inner wall surface of the reaction chamber in the subsequent film formation step.

(Third Embodiment)

Figure 8:
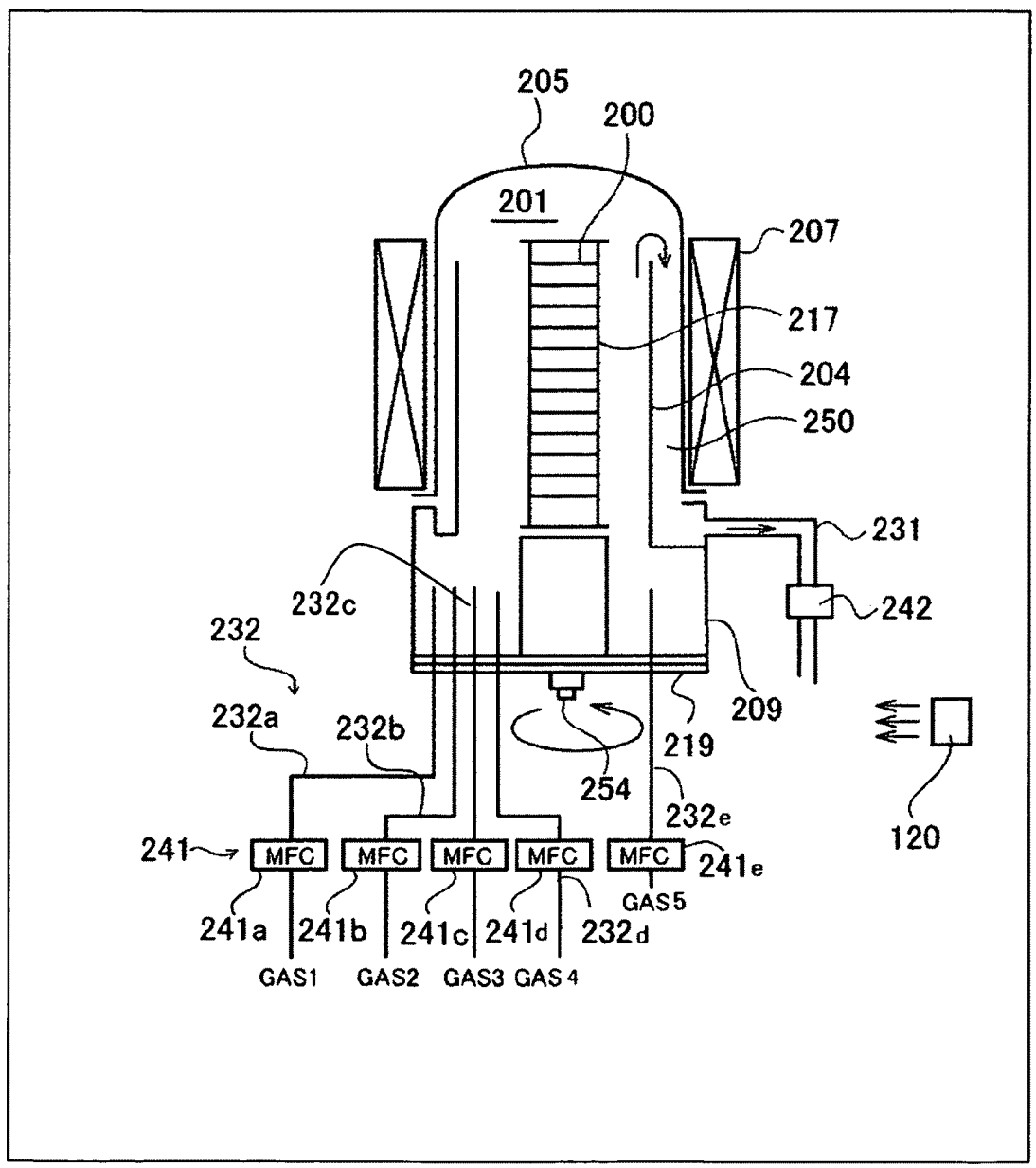
FIG. 8 is a vertical sectional view of the low-pressure CVD processing furnace of the third and fourth embodiments.

In the present embodiment, a gas including boron atoms is used as GAS5 in addition to GAS1 to 4, as shown in FIG. 8. Thus, in the present embodiment, a gas including boron atoms, for example, $BCl_3$ (boron trichloride) is used as GAS5. A gas supply tube 232e and a MFC 241e are provided to supply GAS5.

Other configurations of the processing furnace of the present embodiment are similar to those of the first embodiment.

Figure 6:
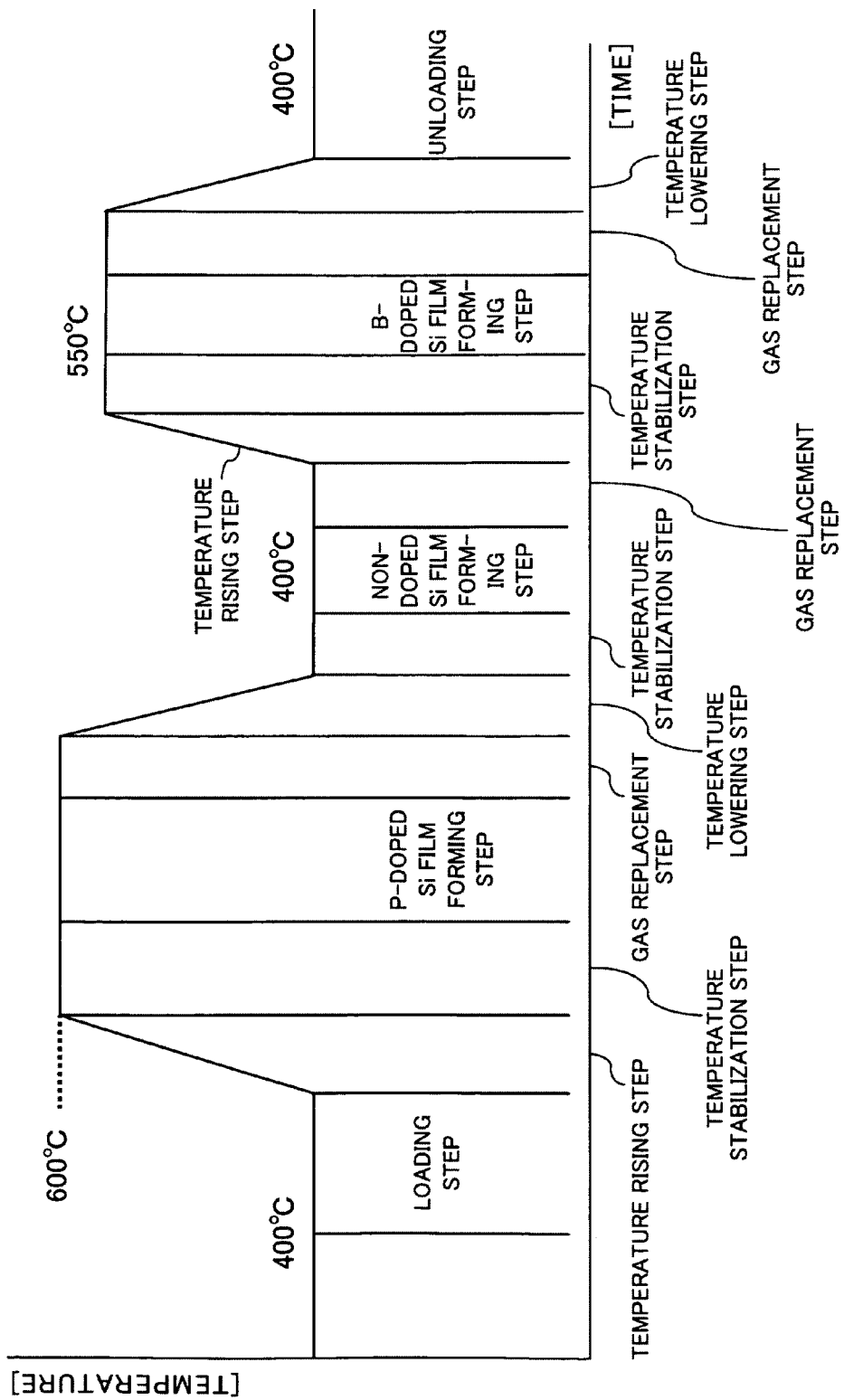
FIG. 6 is a sequence diagram for forming a laminated film of a P-doped Si film, a non-doped Si film, and a B-doped Si film in the third embodiment of the invention.

FIG. 3C shows a laminated film structure obtained by using a P-doped Si film as an N-type semiconductor film constituting a lower layer, a non-doped Si film as an i-type semiconductor film formed thereon, and a B-doped Si film as a P-type semiconductor film formed on the non-doped Si film, the laminated structure being formed by applying the present embodiment. FIG. 6 shows a film formation sequence.

The wafers are heated to a temperature of 600° C., which is a film formation temperature of the P-doped Si film, inside the reaction chamber and the P-doped Si film is formed on the wafer surface by supplying the $SiH_4$ gas and $PH_3$ gas. The $SiH_4$ gas and $PH_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of P into the non-doped Si film and realize a sharp impurity profile in the film. In this case, the temperature is preferably lowered to 400° C. or a lower temperature. As a result, the auto-doping of P into the non-doped Si film can be further inhibited and an even sharper impurity profile in the film can be realized.

The $Si_2H_6$ gas is then discharged from the reaction chamber, the reaction chamber temperature is raised to 550° C., and the B-doped Si film is formed on at least the non-doped Si film by supplying the $SiH_4$ gas and $BCl_3$ gas into the reaction chamber. As a result, the auto-doping of P into the non-doped Si film is inhibited and auto-doping of P into the B-doped Si film is inhibited, thereby making it possible to realize a sharp impurity profile in the film and further increase the film uniformity.

Because the processing sequence after the second film formation step in the present embodiment is different from the film formation sequence explained in the first embodiment, the processing after the second film formation step will be explained below.

After the second film formation step, the gases are discharged from the gas discharge tube 231, while an inactive gas (for example, $N_2$) is being supplied from the gas supply tube 232, whereby the reactive gases that have been used in the second film formation step are discharged from inside the reaction chamber 201 (second gas replacement step).

The temperature inside the reaction chamber 201 is then raised with the heater 207 to a third film formation temperature (temperature rising step). For example, the temperature is raised to 550° C. After completion of the temperature rising step, fine regulation of temperature is performed with the heater 207 to stabilize the reaction chamber 201 at the third film formation temperature (third temperature stabilization step). The gas replacement step and temperature rising step may be performed simultaneously. Where they are performed simultaneously, the throughput can be further increased.

Providing the second gas replacement step is advantageous in terms of facilitating the control of thickness and quality of the second silicon film, but this step may be omitted. In a process including no second gas replacement step, the throughput can be increased.

Once the temperature inside the reaction chamber is stabilized, the gases are discharged from the gas discharge tube 231, while supplying the reactive gases from the gas supply tubes 232 into the reaction chamber 201. The inside of the inner tube 204 is heated with the heater 207 to a third film formation temperature and a film is formed on the surface of wafers 200 (third film formation step).

In this case, where a gas including silicon atoms (for example, $SiH_4$) is supplied as GAS1 from the gas supply tube 232a to the wafers 200, a gas including boron atoms as impurity atoms (for example, $BCl_3$) is supplied as GAS5 from the gas supply tube 232e, and the reaction chamber 201 is heated to and maintained at a temperature of, for example, 550° C., which is the formation temperature of a B-doped. Si film, a silicon film including boron atoms is formed on the wafers 200.

The chemical reaction formula can be represented, for example, as follows: $SiH_4 + BCl_3 \rightarrow$ B-doped Si film.

Upon completion of film formation, the inactive gas is supplied as GAS4 from the gas supply tube 232d, the atmosphere inside the outer tube 205 and inner tube 204 is replaced with the inactive gas, and the normal pressure is restored (third gas replacement step).

The boat 217 is then lowered, and the wafers 200 subjected to the film formation process are taken out of the boat 217 (unloading step).

Where the films are thus formed on the substrate, the concentration of P in the non-doped Si film layer in the vicinity of interface with the P-doped Si layer can be rapidly decreased, the impurity profile can be prevented from broadening, and a sharp impurity profile in the film can be realized. At the same time, because the non-doped Si film is also formed on the inner wall surface of the reaction chamber, the P-doped Si film that has been formed therebelow can be covered. As a result, when the B-doped Si film is thereafter continuously formed on the non-doped Si film located on the wafers in the same reaction chamber, it is possible to inhibit mixing or diffusion of P into the B-doped Si film caused by outward diffusion of P from the P-doped Si film located on the inner walls of the reaction chamber. In this connection, when the B-doped Si film is continuously formed on the non-doped Si film located on the wafers in the same reaction chamber, the temperature is higher than that at the time the non-doped Si film is formed, but because the diffusion rate of P from the P-doped Si film that has been formed on the inner wall surface of the reaction chamber into the non-doped Si film is sufficiently low, the precipitation of P from the surface of the non-doped Si film can be inhibited and the outward diffusion P can be suppressed.

Expressing it differently, in the present embodiment, the $SiH_4$ gas and $PH_3$ gas are discharged from the reaction chamber after the first step, which is the step of forming the P-doped Si film, has been completed, and the temperature inside the reaction chamber is then lowered to 450° C. or a lower temperature. As a result the amount of P that diffuses outwardly from the inner wall surface of the reaction chamber is reduced to a value that can be ignored. Furthermore, by supplying into the reaction chamber the $Si_2H_6$ gas that has a thermal decomposition temperature lower and reactivity higher (easier self-decomposition) than those of $SiH_4$, it is possible to form a non-doped Si film on the substrate in a state in which the inclusion of P is made difficult. In this case, the temperature is preferably lowered to 400° C. or a lower temperature. As a result, the auto-doping of P into the non-doped Si film can be further inhibited and a sharp impurity profile in the film can be realized.

Further, when a P-doped Si film is formed on the wafers, the P-doped Si film is also formed on the inner wall surface of the reaction chamber, and when the non-doped Si film is thereafter formed on the P-doped Si film on the substrate in a continuous manner in the same reaction chamber, the non-doped Si film is also formed on the P-doped Si film located on the inner wall surface of the reaction chamber. Therefore, the non-doped Si film covers the P-doped Si film. As a result, when the B-doped Si film is thereafter formed in a continuous manner in the same reaction chamber on the non-doped Si film located on the wafers, it is possible to inhibit mixing or diffusion of P into the B-doped Si film caused by outward diffusion of P from the P-doped Si film located on the inner walls of the reaction chamber.

Where the films are formed on the substrate by a non-plasma processing in this manner, an expensive plasma generator for a plasma processing can be eliminated.

The range of preferred conditions in the present embodiment includes the following conditions in addition to those of the first embodiment.

$BCl_3$ (borontrichloride) and $B_2H_6$ (diborane) are examples of the gas including boron atoms that is used as GAS5.

Where a B-doped Si film is formed as a P-type semiconductor film by using a gas including boron atoms and a gas including silicon atoms on the non-doped Si film serving as an i-type semiconductor film, in a film formation process that seeks to ensure a film uniformity within ±5% and an impurity concentration of greater than 1E18 atoms/cc and equal to or less than 1E21 atoms/cc, the preferred temperature range for effective formation of the B-doped Si film is 450-550° C. (equal to or higher than 450° C. and equal to or lower than 550° C.).

Where a B-doped Si film is formed using a boron-containing gas and a silicon-containing gas on the non-doped Si film, the preferred pressure range is 0.1 to 10 Torr (13.3 to 1330 Pa (equal to or higher than 13.3 Pa and equal to or lower than 1330 Pa)).

The control of B concentration in the film is performed by regulating the gas flow rate and pressure by controlling the MFC 241 and pressure regulator 242 with the main control device 120.

COMPARATIVE EXAMPLE

Film formation with a sharp impurity concentration distribution can be realized by forming a film substrate in the above-described manner. The reasons why such an impurity concentration distribution cannot be realized with another film formation sequence shown in FIG. 14 will be described below.

Wafers are heated to and maintained at a temperature, for example, of 600° C., which is a film formation temperature for a P-doped Si film, inside the reaction chamber, and a P-doped Si film is formed on the wafer surface by supplying the $SiH_4$ gas and $PH_3$ gas. The $SiH_4$ gas and $PH_3$ gas are then discharged from the reaction chamber. Then, only the $SiH_4$ gas is supplied into the reaction chamber and a non-doped Si film is formed on the wafers.

In a case where the non-doped Si film is laminated and continuously formed on the P-doped Si film, for example, in a case where the P-doped Si film is formed at a temperature of 600° C. and then the inside of the same reaction chamber is continuously heated to and maintained at 600° C. and a non-doped Si film is formed, a P-doped Si film including a large amount of P is formed on the inner wall surface of the reaction chamber, and even after the supply of the $PH_3$ gas is stopped and the gas is discharged, the P diffuses outwardly from the wall surface and P is present at all times inside the reaction chamber. As a result, even when the non-doped Si film is formed in the next step by supplying only the $SiH_4$ gas, this outwardly diffused P penetrates into the film and a P-doped Si film is formed, although the concentration of phosphorus therein is low.

As a result of such a reaction, the profile of P doped amount in the laminated film composed of the P-doped Si film and non-doped Si film on the wafer is apparently a broad profile in which the concentration of P in the non-doped Si film layer in the vicinity of the interface with the P-doped Si film serving as the base layer therefor decreases gradually, rather than drops rapidly.

Figure 14:
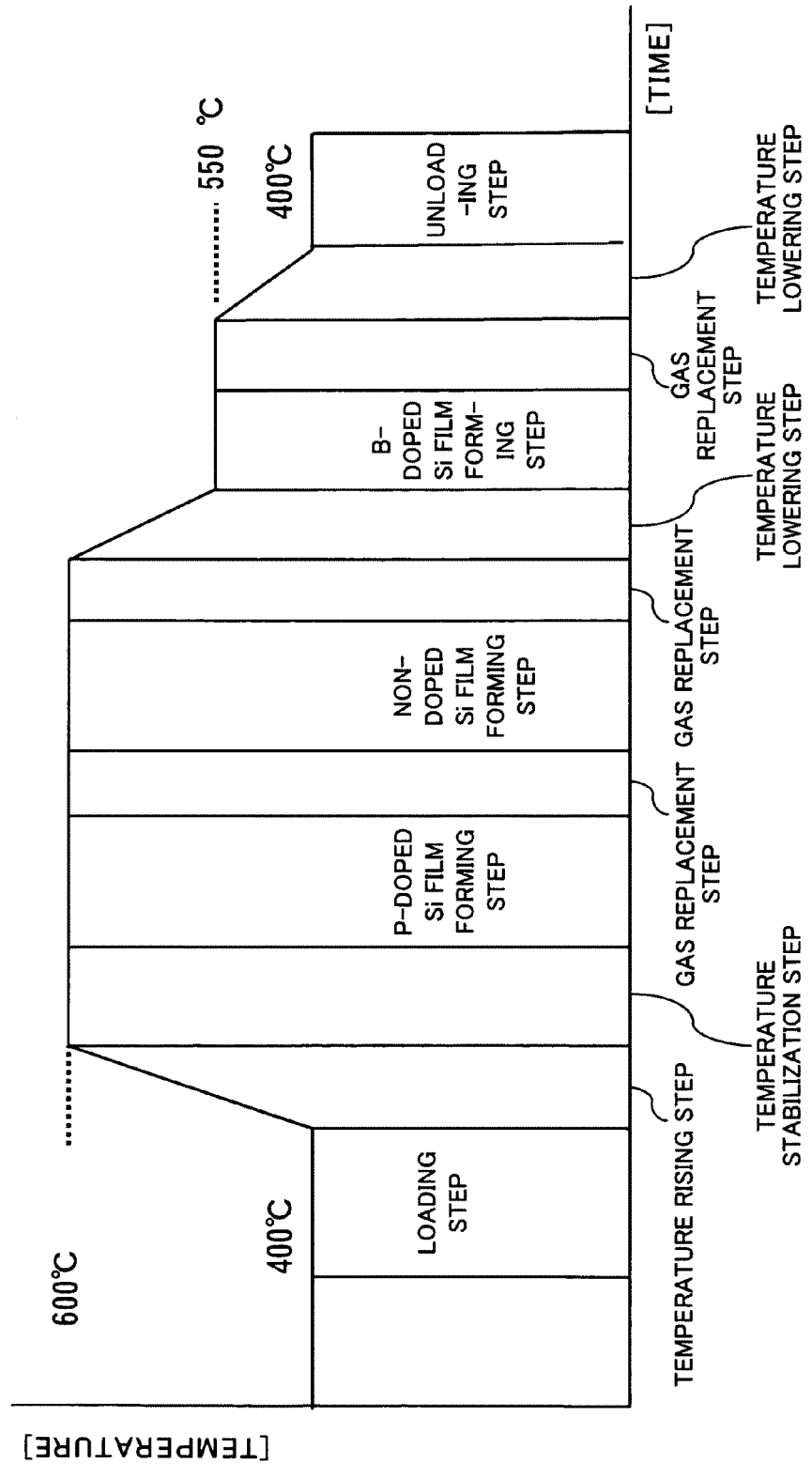
FIG. 14 is a comparative sequence diagram corresponding to the sequence diagram for forming a laminated film of a P-doped Si film, a non-doped Si film, and a B-doped Si film in the third embodiment of the invention.
Figure 15:
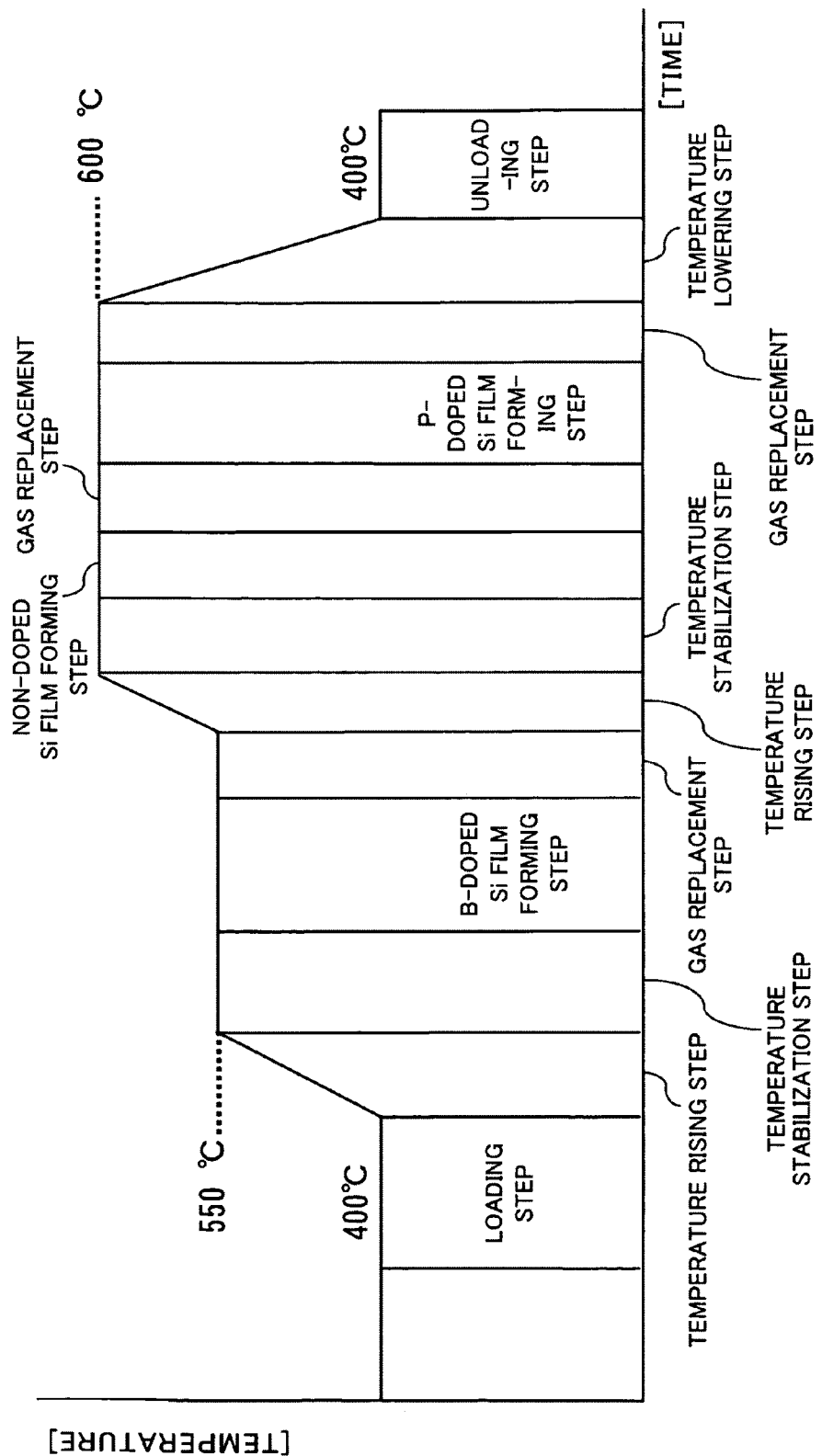
FIG. 15 is a comparative sequence diagram corresponding to the sequence diagram for forming a laminated film of a B-doped Si film, a non-doped Si film, and a P-doped Si film in the fourth embodiment of the invention.
Figure 16:
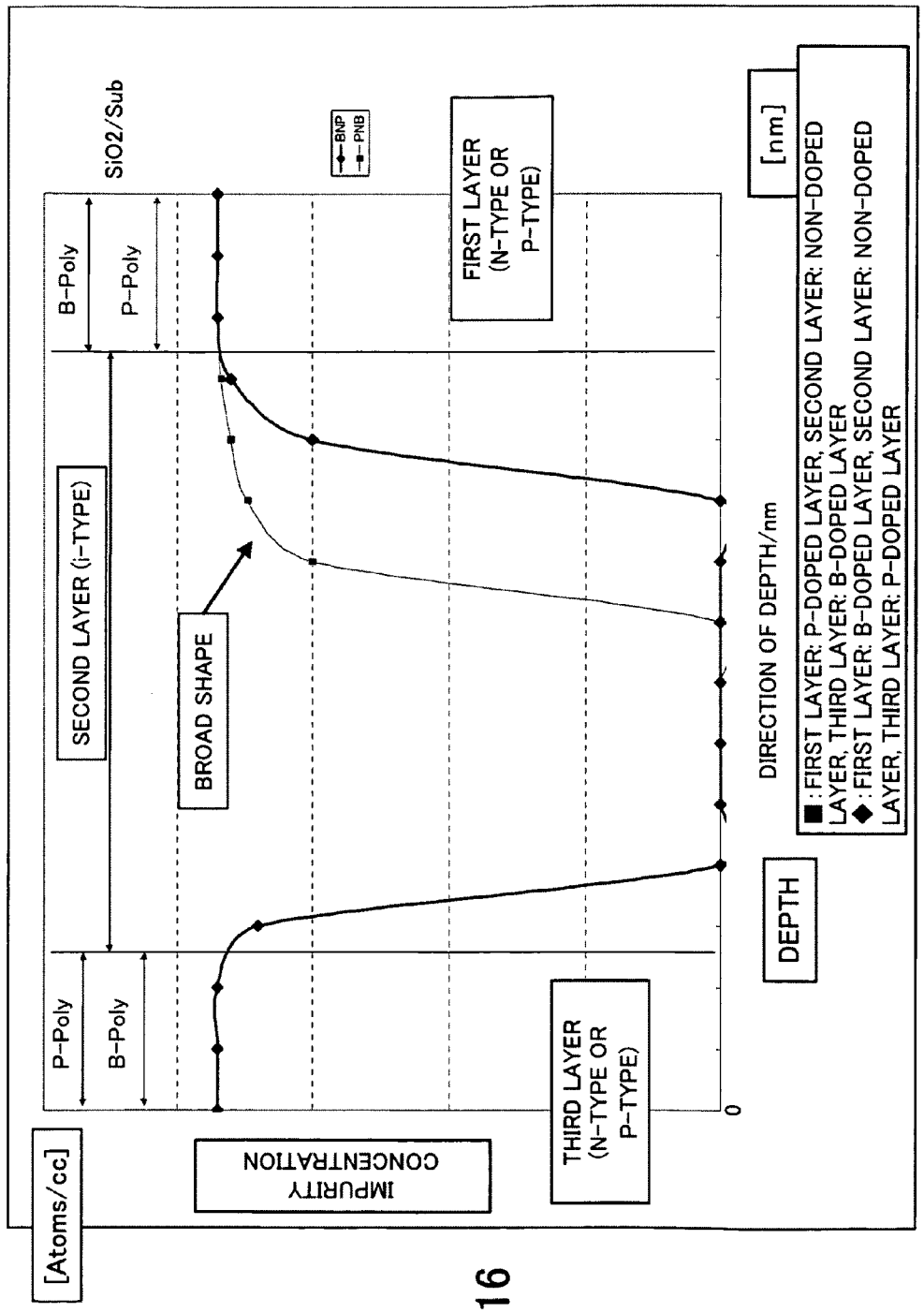
FIG. 16 is a graph illustrating an impurity profile in the laminated film of a P-doped Si film, a non-doped Si film, and a B-doped Si film and an impurity profile in the laminated film of a B-doped Si film, a non-doped Si film, and a P-doped Si film in the comparative sequence corresponding to the sequence of the third embodiment and fourth embodiment, respectively.

Graphs in FIG. 16 show the film formation evaluation results obtained when the comparative sequences shown in FIGS. 14 and 15 were used. Thus, the graph shows an impurity profile in a laminated film composed of a P-doped Si film, a non-doped Si film, and a B-doped Si film, and an impurity profile in a laminated film composed of a B-doped Si film, a non-doped Si film, and a P-doped Si film.

The depth in the film (thickness direction) is plotted against the abscissa; the farther to the right, the closer to the wafer. The units are nanometers.

The concentration of P or B in the film is plotted against the ordinate; the concentration increases upward. The units are Atoms/cc.

As shown in FIG. 16, in a case where the comparative sequence shown in FIG. 14 is used, P diffuses not only into the P-doped Si film of the lower layer, but also into the non-doped Si film of the upper layer. In the impurity concentration distribution (concentration profile) in the non-doped Si film, such as, in the vicinity of 125 nm, which is close to the interface with the P-doped Si film that is base layer, the concentration of P decreases gradually, rather than rapidly, the decrease starts, such as, in the vicinity of 120 nm and the concentration becomes less than 1E18 atoms/cc, such as, in the vicinity of 100 nm. Thus, the concentration distribution of P in the non-doped Si film becomes broad.

(Effects)

With the above-described embodiment, one or several below-described effects are attained in addition to the effects described with reference to the first embodiment.

(1) When a silicon film including impurity atoms is formed at least on the wafers, the silicon film including the impurity atoms is also formed on the inner wall surface of the reaction chamber, and when the non-doped silicon film is thereafter formed at least on the silicon film including the impurity atoms on the wafers in a continuous manner in the same reaction chamber, the non-doped silicon film is also formed on the silicon film including the impurity atoms located on the inner wall surface of the reaction chamber. As a result, the non-doped silicon film covers the impurity atoms on the inner wall surface of the reaction chamber, and when a film is thereafter continuously formed on the non-doped Si film located on the wafers in the same reaction chamber, it is possible to inhibit mixing or diffusion of P into the B-doped Si film caused by outward diffusion of impurities from the inner walls of the reaction chamber.

(2) Where the impurity-doped Si film, non-doped Si film, and impurity-doped Si film are formed discontinuously, the efficiency is poor and throughput is degraded. Further, where the impurity-doped Si film and non-doped Si film are exposed to an oxygen-containing atmosphere such as air after the film has been formed, for example, when the films are formed in separate substrate processing apparatuses, a structure is obtained in which a natural oxidation film is sandwiched at the interface between the impurity-doped Si film and non-doped Si film. The demerit of the structure in which such natural oxidation film is present is that where the laminated structure is used as a semiconductor device such as a capacitor, a spread of electric characteristics, such as the occurrence diffusion current or drift current, occurs. However, because a Si film containing no impurity atoms or having an impurity concentration lower than that of the impurity-doped Si film can be formed at least on the impurity-doped Si film in a continuous manner in the same reaction chamber after the impurity-doped Si film has been formed and the impurity-doped Si film can be formed on the Si film containing no impurity atoms or having an impurity concentration lower than that of the impurity-doped Si film, it is possible to obtain a highly clean interface in the laminated structure, while maintaining high productivity.

(3) The P concentration that usually has a broad profile at the interface of the laminated film composed of a P-doped Si film and a non-doped Si film can be made to have a sharp profile. By forming such a profile, it is possible to control rectification characteristics when a structure composed of a P-doped Si film, a non-doped Si film, and a B-doped Si film is produced.

(4) By forming a sharp impurity profile, it is possible to prevent the occurrence of a vacancy layer and occurrence of diffusion current and drift current in the production of a structure composed of a P-doped Si film, a non-doped Si film, and a B-doped Si film.

(5) By forming a sharp impurity profile, it is possible to control the drop degree of forward bias and breakdown voltage of reverse bias in the production of a structure composed of a P-doped Si film, a non-doped Si film, and a B-doped Si film.

(Fourth Embodiment)

In the present embodiment, a gas including phosphorus atoms is used as GAS5 in addition to GAS1 to 4, as shown in FIG. 8. Thus, in the present embodiment, a gas including phosphorus atoms, for example, $PH_3$ (phosphine) is used as the GAS5. A gas supply tube 232e and a MFC 241e are provided to supply the GAS5.

Other configurations of the processing furnace of the present embodiment are similar to those of the first embodiment.

Figure 7:
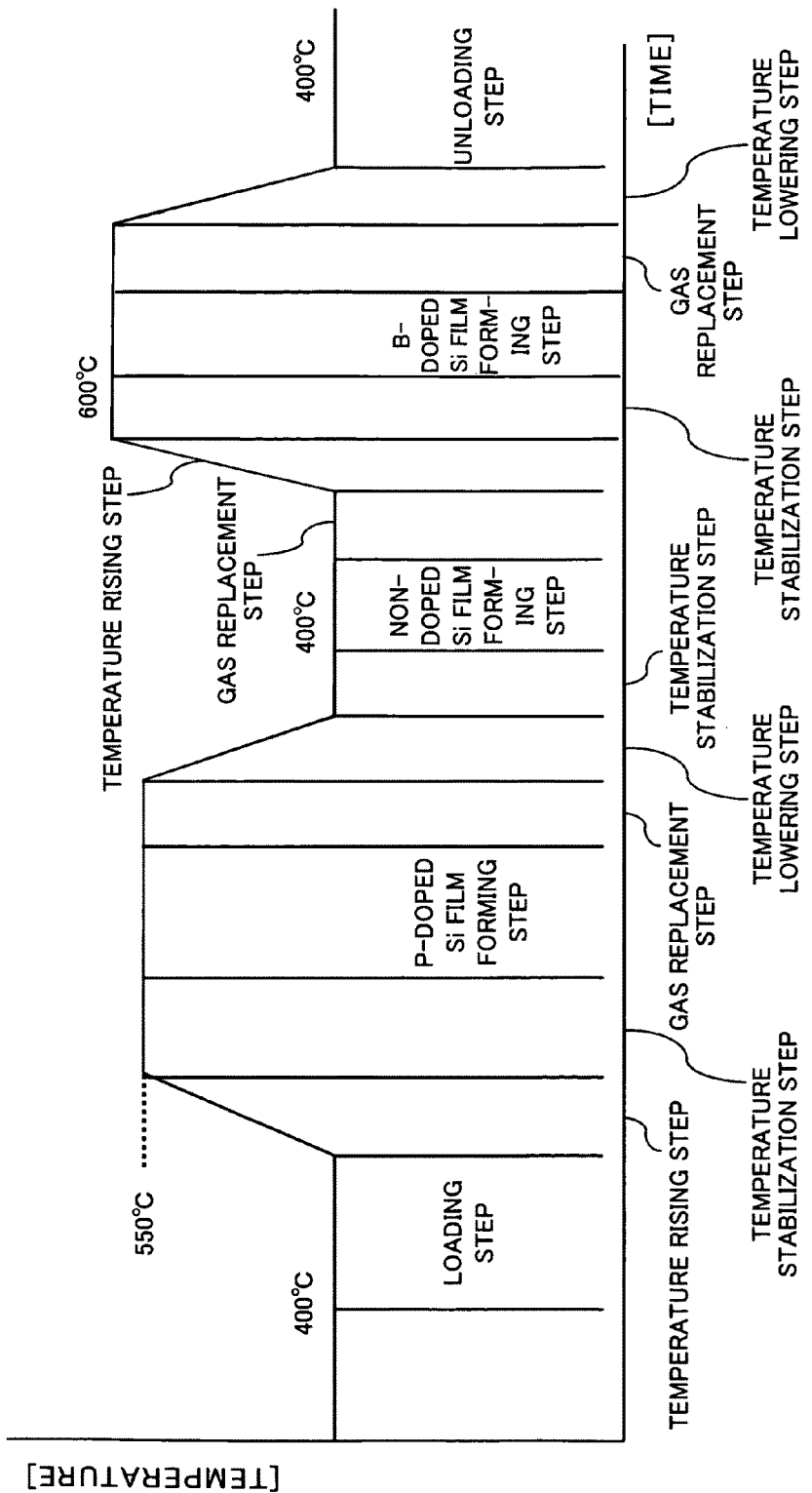
FIG. 7 is a sequence diagram for forming a laminated film of a B-doped Si film, a non-doped Si film, and a P-doped Si film in the fourth embodiment of the invention.

FIG. 3D shows a laminated film structure obtained by using a B-doped Si film as a P-type semiconductor film constituting a lower layer, a non-doped Si film as an i-type semiconductor film formed thereon, and a P-doped Si film as an N-type semiconductor film formed on the non-doped Si film, the laminated structure being formed by applying the present embodiment. FIG. 7 shows a film formation sequence.

The wafers are heated to a temperature of 550° C., which is a film formation temperature of the B-doped Si film, inside the reaction chamber and the B-doped Si film is formed on the wafer surface by supplying the $SiH_4$ gas and $BCl_3$ gas. The $SiH_4$ gas and $BCl_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of B into the non-doped Si film and realize a sharp impurity profile in the film. In this case, the temperature is preferably lowered to 400° C. or a lower temperature. As a result, the auto-doping of B into the non-doped Si film can be further inhibited and an even sharper impurity profile in the film can be realized.

The $Si_2H_6$ gas is then discharged from the reaction chamber. The reaction chamber temperature is raised to 600° C., and the P-doped Si film is formed on at least the non-doped Si film by supplying the $SiH_4$ gas and $PH_3$ gas into the reaction chamber. As a result, the auto-doping of P into the non-doped Si film is inhibited and auto-doping of B into the P-doped Si film is inhibited, thereby making it possible to realize a sharp impurity profile in the film and further increase the film uniformity.

Because the processing sequence after the second film formation step in the present embodiment is different from the film formation sequence explained in the second embodiment, the processing after the second film formation step will be explained below.

After the second film formation step, gases are discharged from the gas discharge tube 231, while an inactive gas (for example, $N_2$) is being supplied from the gas supply tube 232, whereby the reactive gases that have been used in the second film formation step are discharged from inside the reaction chamber 201 (second gas replacement step).

The temperature inside the reaction chamber 201 is then raised with the heater 207 to a third film formation temperature (temperature rising step). For example, the temperature is raised to 600° C. After completion of the temperature rising step, fine regulation of temperature is performed with the heater 207 to stabilize the reaction chamber 201 at the third film formation temperature (third temperature stabilization step).

The gas replacement step and temperature rising step may be performed simultaneously. Where they are performed simultaneously, the throughput can be further increased.

Providing the second gas replacement step is advantageous in terms of facilitating the thickness and quality control of the second silicon film, but this step may be omitted. In a process including no second gas replacement step, the throughput can be increased.

Once the temperature is stabilized, the gases are discharged from the gas discharge tube 231, while supplying the reactive gases from the gas supply tubes 232 into the reaction chamber 201. The inside of the inner tube 204 is heated with the heater 207 to a third film formation temperature and a film is formed on the surface of wafers 200 (third film formation step).

In this case, where a gas including silicon atoms (for example, $SiH_4$) is supplied as GAS1 from the gas supply tube 232a to the wafers 200, a gas including phosphorus atoms as impurity atoms (for example, $PH_3$) is supplied as GAS5 from the gas supply tube 232e, and the reaction chamber 201 is heated to and maintained at a temperature of, for example, 600° C., which is the formation temperature of a P-doped Si film, a silicon film including phosphorus atoms is formed on the wafers 200.

The chemical reaction formula can be represented, for example, as follows: $SiH_4+PH_3 \rightarrow$ phosphorus-doped Si film.

Upon completion of film formation, the inactive gas is supplied from the gas supply tube 232, the atmosphere inside the outer tube 205 and inner tube 204 is replaced with the inactive gas, and the normal pressure is restored (third gas replacement step).

The boat 217 is then lowered and the wafers 200 subjected to the film formation process are taken out of the boat 217 (unloading step).

Where the films are thus formed on the substrate, the concentration of B in the non-doped Si film layer in the vicinity of interface with the B-doped Si layer is rapidly decreased, thereby making it possible to prevent the impurity profile from broadening and realize a sharp impurity profile in the film. Mixing and diffusion of P into the P-doped Si film can be also inhibited.

At the same time, because the non-doped Si film is also formed on the inner wall surface of the reaction chamber, the B-doped Si film that has been formed therebelow can be covered. As a result, when the P-doped Si film is thereafter continuously formed on the non-doped Si film located on the wafers in the same reaction chamber, it is possible to inhibit mixing or diffusion of B into the P-doped Si film caused by outward diffusion of B from the B-doped Si film located on the inner walls of the reaction chamber. In this connection, when the P-doped Si film is continuously formed on the non-doped Si film located on the wafers in the same reaction chamber, the temperature is equal to that at the time the non-doped Si film is formed, but because the diffusion rate of B from the B-doped Si film that has been formed on the inner wall surface of the reaction chamber into the non-doped Si film is sufficiently low, the precipitation of B from the surface of the non-doped Si film can be inhibited and the outward diffusion B can be suppressed.

Expressing it differently, in the present embodiment, the $SiH_4$ gas and $BCl_3$ gas are discharged from the reaction chamber after the first step, which is the step of forming the P-doped Si film, has been completed, and the temperature inside the reaction chamber is then lowered to 450° C. or a lower temperature. As a result the amount of B that diffuses outwardly from the inner wall surface of the reaction chamber is reduced to a value that can be ignored. Furthermore, by supplying into the reaction chamber the $Si_2H_6$ gas that has a thermal decomposition temperature lower and reactivity higher (easier self-decomposition) that $SiH_4$, it is possible to form a non-doped Si film on the substrate in a state in which the inclusion of B is made difficult. In this case, the temperature is preferably lowered to 400° C. or a lower temperature. As a result, the auto-doping of B into the non-doped Si film can be further inhibited and a sharp impurity profile in the film can be realized.

Further, when a B-doped Si film is formed on the wafers, the B-doped Si film is also formed on the inner wall surface of the reaction chamber, and when the non-doped Si film is thereafter formed on the B-doped Si film on the substrate in a continuous manner in the same reaction chamber, the non-doped Si film is also formed on the B-doped Si film located on the inner wall surface of the reaction chamber. Therefore, the non-doped Si film covers the B-doped Si film. As a result, when the P-doped Si film is thereafter formed in a continuous manner in the same reaction chamber on the non-doped Si film located on the wafers, it is possible to inhibit mixing or diffusion of B into the P-doped Si film caused by outward diffusion of B from the B-doped Si film located on the inner walls of the reaction chamber.

Where the films are formed on the substrate by a non-plasma processing in this manner, an expensive plasma generator for a plasma processing can be eliminated.

The range of preferred conditions in the present embodiment includes the following conditions in addition to those of the second embodiment.

$PH_3$ (phosphine) is an example of the gas including phosphorus atoms that is used as GAS5.

Where a P-doped Si film is formed as an N-type semiconductor film by using a gas including phosphorus atoms and a gas including silicon atoms on the non-doped Si film serving as an i-type semiconductor film, in a film formation process that seeks to ensure a film uniformity within ±5% and an impurity concentration of greater than 1E18 atoms/cc and equal to or less than 1E21 atoms/cc, the preferred temperature range for effective formation of the P-doped Si film is 530-600° C. (equal to or higher than 530° C. and equal to or lower than 600° C.)

Where a P-doped Si film is formed using a phosphorus-containing gas and a silicon-containing gas on the non-doped Si film, the preferred pressure range is 0.1 to 10 Torr (13.3 to 1330 Pa (equal to or higher than 13.3 Pa and equal to or lower than 1330 Pa)).

The control of P concentration in the film is performed by regulating the gas flow rate and pressure by controlling the MFC 241 and pressure regulator 242 with the main control device 120.

COMPARATIVE EXAMPLE

Film formation with a sharp impurity concentration distribution can be realized by forming a film substrate in the above-described manner. The reasons why such an impurity concentration distribution cannot be realized with another film formation sequence shown in FIG. 15 will be described below.

Wafers are heated to and maintained at a temperature, for example, of 550° C., which is a film formation temperature for a B-doped Si film, inside the reaction chamber, and a B-doped Si film is formed on the wafer surface by supplying the $SiH_4$ gas and $BCl_3$ gas. The $SiH_4$ gas and $BCl_3$ gas are then discharged from the reaction chamber. Then, only the $SiH_4$ gas is supplied into the reaction chamber and a non-doped Si film is formed on the wafers.

In a case where the non-doped Si film is laminated and continuously formed on the B-doped Si film, for example, in a case where the B-doped Si film is formed at a temperature of 550° C. and then the temperature inside the same reaction chamber is raised to 600° C. and a non-doped Si film is formed, while this temperature is maintained, a B-doped Si film including a large amount of B is formed on the inner wall surface of the reaction chamber, and even after the supply of the $BCl_3$ gas is stopped and the gas is discharged, the B diffuses outwardly from the wall surface and B is present at all times inside the reaction chamber. Thus, even when the non-doped Si film is formed in the next step by supplying only the $SiH_4$ gas, this outwardly diffused B penetrates into the film and a B-doped Si film is formed, although the concentration of boron therein is low.

As a result of such a reaction, the profile of B doped amount in the laminated film composed of the B-doped Si film and non-doped Si film on the wafer is apparently a broad profile in which the concentration of B in the non-doped Si film layer in the vicinity of the interface with the B-doped Si film serving as the base layer therefor decreases gradually, rather than drops rapidly.

Graphs in FIG. 16 show the film formation evaluation results obtained when the comparative sequences shown in FIGS. 14 and 15 were used. Thus, the graph shows an impurity profile in a laminated film composed of a P-doped Si film, a non-doped Si film, and a B-doped Si film, and an impurity profile in a laminated film composed of a B-doped Si film, a non-doped Si film, and a P-doped Si film.

The depth in the film (thickness direction) is plotted against the abscissa; the farther to the right, the closer to the wafer. The units are nanometers.

The concentration of P or B in the film is plotted against the ordinate; the concentration increases upward. The units are Atoms/cc.

As shown in FIG. 16, in a case where the comparative sequence shown in FIG. 15 is used, B diffuses not only into the B-doped Si film of the lower layer, but also into the non-doped Si film of the upper layer. In the impurity concentration distribution (concentration profile) in the non-doped Si film, such as, in the vicinity of 125 nm, which is close to the interface with the B-doped Si film that is base layer, the concentration of B decreases gradually, rather than rapidly, the decrease starts, such as, in the vicinity of 110 nm and the concentration becomes less than 1E18 atoms/cc, such as, in the vicinity of 80 nm. Thus, the concentration distribution of B in the non-doped Si film becomes broad.

(Effects)

With the above-described embodiment, one or several below-described effects are attained in addition to the effects described with reference to the first to third embodiment.

(1) When a B-doped Si film is formed at least on the wafers, the B-doped Si film is also formed on the inner wall surface of the reaction chamber, and when the non-doped Si film is thereafter formed at least on the B-doped Si film on the wafer in a continuous manner in the same reaction chamber, the non-doped Si film is also formed on the B-doped Si film located on the inner wall surface of the reaction chamber. As a result, the non-doped Si film covers the impurity atoms on the inner wall surface of the reaction chamber, and when a P-doped Si film is thereafter continuously formed on the non-doped Si film located on the wafers in the same reaction chamber, it is possible to inhibit mixing or diffusion of B into the P-doped Si film caused by outward diffusion of B from the inner walls of the reaction chamber.

(2) The B concentration that usually has a broad profile at the interface of the laminated film composed of a B-doped Si film and a non-doped Si film can be made to have a sharp profile. By forming such a profile, it is possible to control rectification characteristics when a structure composed of a B-doped Si film, a non-doped Si film, and a P-doped Si film is produced.

(3) By forming a sharp impurity profile, it is possible to prevent the occurrence of a vacancy layer and occurrence of diffusion current and drift current in the production of a structure composed of a B-doped Si film, a non-doped Si film, and a P-doped Si film.

(4) By forming a sharp impurity profile, it is possible to control the drop degree of forward bias and breakdown voltage of reverse bias in the production of a structure composed of a B-doped Si film, a non-doped Si film, and a P-doped Si film.

(Fifth Embodiment)

In the present embodiment, GAS3 is not used. Therefore, the gas supply tube 232*c* and MFC 241*c* may be omitted.

Other configurations are similar to those of the processing furnace relating to the first embodiment.

Figure 9:
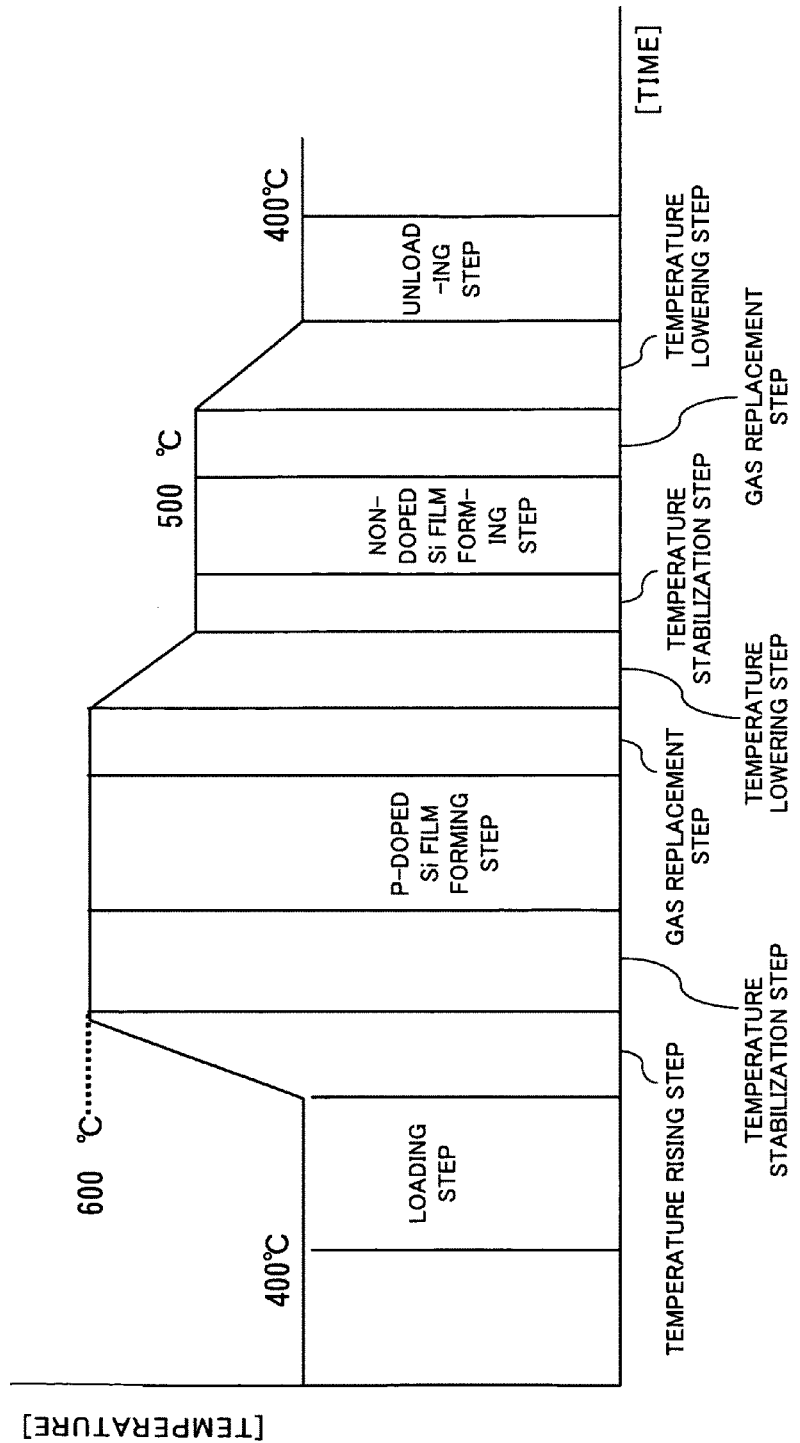
FIG. 9 is a sequence diagram for forming a laminated film of a P-doped Si film and a non-doped Si film in the fifth embodiment of the invention.

FIG. 9 shows a film formation sequence of the present embodiment in which a P-doped Si film as an N-type semiconductor film and a non-doped Si film as an i-type semiconductor film is formed. The difference between this sequence and that of the first embodiment is only in film formation temperature and gas species that are supplied when the non-doped Si film is formed. Others are similar to the sequence of the first embodiment.

The wafers are heated to a temperature of 600° C., which is a film formation temperature of the P-doped Si film, inside the reaction chamber and the P-doped Si film is formed on the wafer surface by supplying the $SiH_4$ gas and $PH_3$ gas. The $SiH_4$ gas and $PH_3$ gas are then discharged from the reaction chamber. The temperature in the reaction chamber is then lowered to 500° C. or a lower temperature, and the $SiH_4$ gas is supplied into the reaction chamber. By lowering the temperature, it is possible to inhibit the auto-doping of P into the non-doped Si film and realize a sharp impurity profile in the film. In this case, although the effect of inhibiting the auto-doping of P is demonstrated, because the film formation temperature during the formation of the non-doped Si film is as high as about 500° C., the initial doped amount of P is difficult to inhibit, the amount of precipitation of P contained in the P-doped Si film from the film surface can increase, and the amount of auto-doped P can somewhat increase over that in the first embodiment. As a result, it is preferred that a limitation be placed on process conditions other than the temperature. For example, the pressure during the formation of the non-doped Si film may be decreased with respect to that during the formation of the P-doped Si film. Further, where the films are formed on the substrate by a non-plasma processing in this manner, an expensive plasma generator for a plasma processing can be eliminated.

(Effects)

With the above-described embodiment, one or several below-described effects are attained in addition to the effects described with reference to the first embodiment.

(1) By decreasing the reaction chamber temperature by 50° C. or more after a P-doped Si film has been formed by using a gas including silicon atoms and a gas including phosphorus atoms as impurities, it is possible to reduce the amount of P that diffuses outwardly from the inner wall surface of the reaction chamber and the non-doped Si film can be formed in a state in which the inclusion of P is made difficult.

(2) Because the non-doped Si film is also formed on the inner wall surface of the reaction chamber when the non-doped Si film is formed on the wafers, the non-doped Si film can be coated on the P-doped Si film that has been formed therebelow and the outward diffusion of P from the P-doped Si film located on the inner wall surface of the reaction chamber in the subsequent film formation process can be inhibited.

(3) Because $SiH_4$ is used as the gas including Si atoms in both the P-doped Si film and the non-doped Si film, it is not necessary to use another gas including Si atoms and it is not necessary to provide a gas supply tube and an MFC for the another gas including Si atoms.

Sixth Embodiment

In the present embodiment, GAS5 is not used. Therefore, the gas supply tube 232e and MFC 241e may be omitted.

Other configurations are similar to those of the processing furnace relating to the third embodiment.

Figure 10:
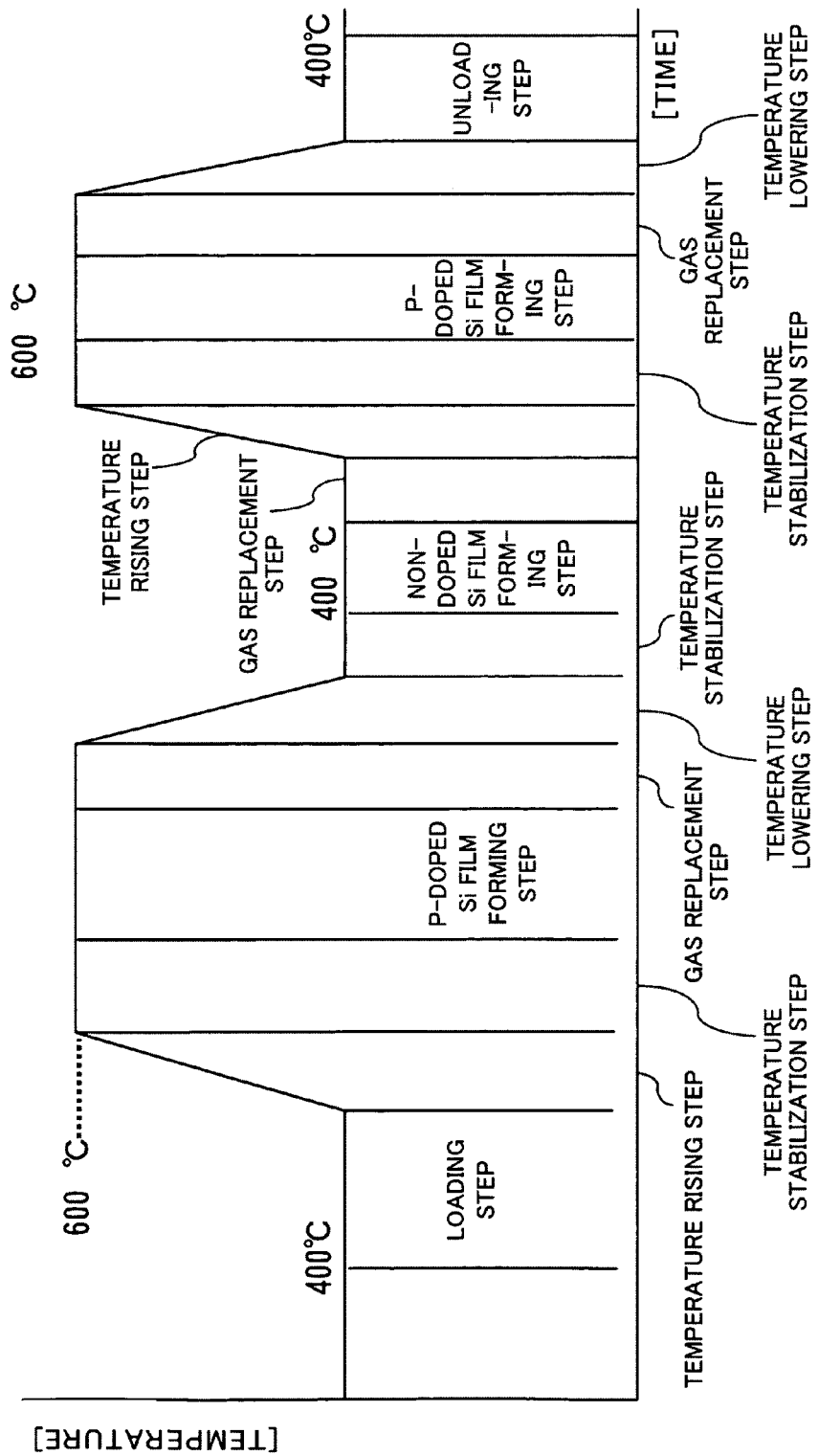
FIG. 10 is a sequence diagram for forming a laminated film of a P-doped Si film, a non-doped Si film, and a P-doped Si film in the sixth embodiment of the invention.

FIG. 10 shows a film formation sequence of the present embodiment in which a laminated film composed of a P-doped Si film as an N-type semiconductor film, a non-doped Si film as an i-type semiconductor film, and a P-doped Si film as an N-type semiconductor film is formed. The main difference between this sequence and that of the third embodiment is that the B-doped Si film formed on the non-doped Si film in the third film formation step is replaced with the P-doped Si film. Other features are substantially similar to those of the sequence of the third embodiment.

The wafers are heated to a temperature of 600° C., which is a film formation temperature of the P-doped Si film, inside the reaction chamber and the P-doped Si film is formed on the wafer surface by supplying the $SiH_4$ gas and $PH_3$ gas. The $SiH_4$ gas and $PH_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of P into the non-doped Si film and realize a sharp impurity profile in the film. The $Si_2H_6$ gas is then discharged from the reaction chamber. In this case, the temperature is preferably lowered to 400° C. or a lower temperature. As a result, the auto-doping of P into the non-doped Si film can be further inhibited and an even sharper impurity profile in the film can be realized.

The reaction chamber temperature is then raised to 600° C., and the P-doped Si film is formed on at least the non-doped Si film by supplying the $SiH_4$ gas and $PH_3$ gas into the reaction chamber.

The reaction chamber temperature is then lowered to 400° C. or a lower temperature and the wafers are unloaded from the reaction chamber. With the invention of the present embodiment, it is possible to inhibit the auto-doping of P into the non-doped Si film and realize a sharp impurity profile in the film. Further, where the films are formed on the substrate by a non-plasma processing in this manner, an expensive plasma generator for a plasma processing can be eliminated.

(Seventh Embodiment)

In the present embodiment, GAS5 is not used. Therefore, the gas supply tube 232e and MFC 241e may be omitted.

Other configurations are similar to those of the processing furnace relating to the fourth embodiment.

Figure 11:
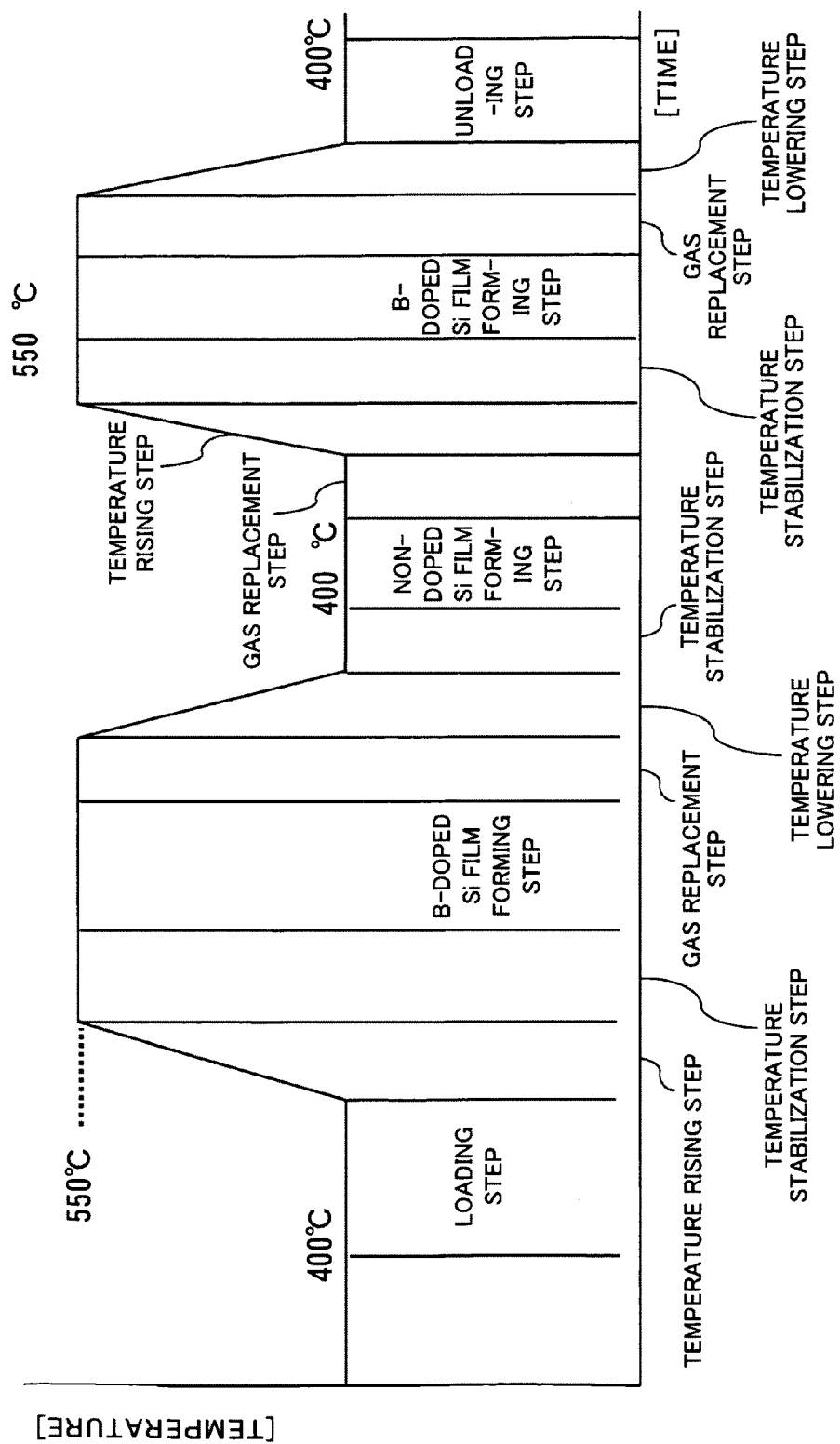
FIG. 11 is a sequence diagram for forming a laminated film of a B-doped Si film, a non-doped Si film, and a B-doped Si film in the seventh embodiment of the invention.

FIG. 11 shows a film formation sequence of the present embodiment in which a laminated film composed of a P-doped Si film as an N-type semiconductor film, a non-doped Si film as an i-type semiconductor film, and a P-doped Si film as an N-type semiconductor film is formed. The difference between this sequence and that of the fourth embodiment is that the P-doped Si film formed on the non-doped Si film in the third film formation step is replaced with the B-doped Si film. Other features are substantially similar to those of the sequence of the fourth embodiment.

The wafers are heated to a temperature of 550° C., which is a film formation temperature of the B-doped Si film, inside the reaction chamber and the B-doped Si film is formed on the wafer surface by supplying the $SiH_4$ gas and $BCl_3$ gas. The $SiH_4$ gas and $BCl_3$ gas are then discharged from the reaction chamber. The temperature in the reaction chamber is then lowered to 450° C. or a lower temperature, and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of B into the non-doped Si film and realize a sharp impurity profile in the film. In this case, the temperature is preferably lowered to 400° C. or a lower temperature. As a result, the auto-doping of B into the non-doped Si film can be further inhibited and an even sharper impurity profile in the film can be realized.

The $Si_2H_6$ gas is then discharged from the reaction chamber. The reaction chamber temperature is raised to 550° C., and the B-doped Si film is formed on at least the non-doped Si film by supplying the $SiH_4$ gas and $BCl_3$ gas into the reaction chamber. The reaction chamber temperature is then lowered to 400° C. or a lower temperature and the wafers are unloaded from the reaction chamber.

With the invention of the present embodiment, it is possible to inhibit the auto-doping of B into the non-doped Si film and realize a sharp impurity profile in the film. Further, where the films are formed on the substrate by a non-plasma processing in this manner, an expensive plasma generator for a plasma processing can be eliminated.

(Eighth Embodiment)

The processing furnace of the present embodiment is similar to that of the third embodiment.

Figure 12:
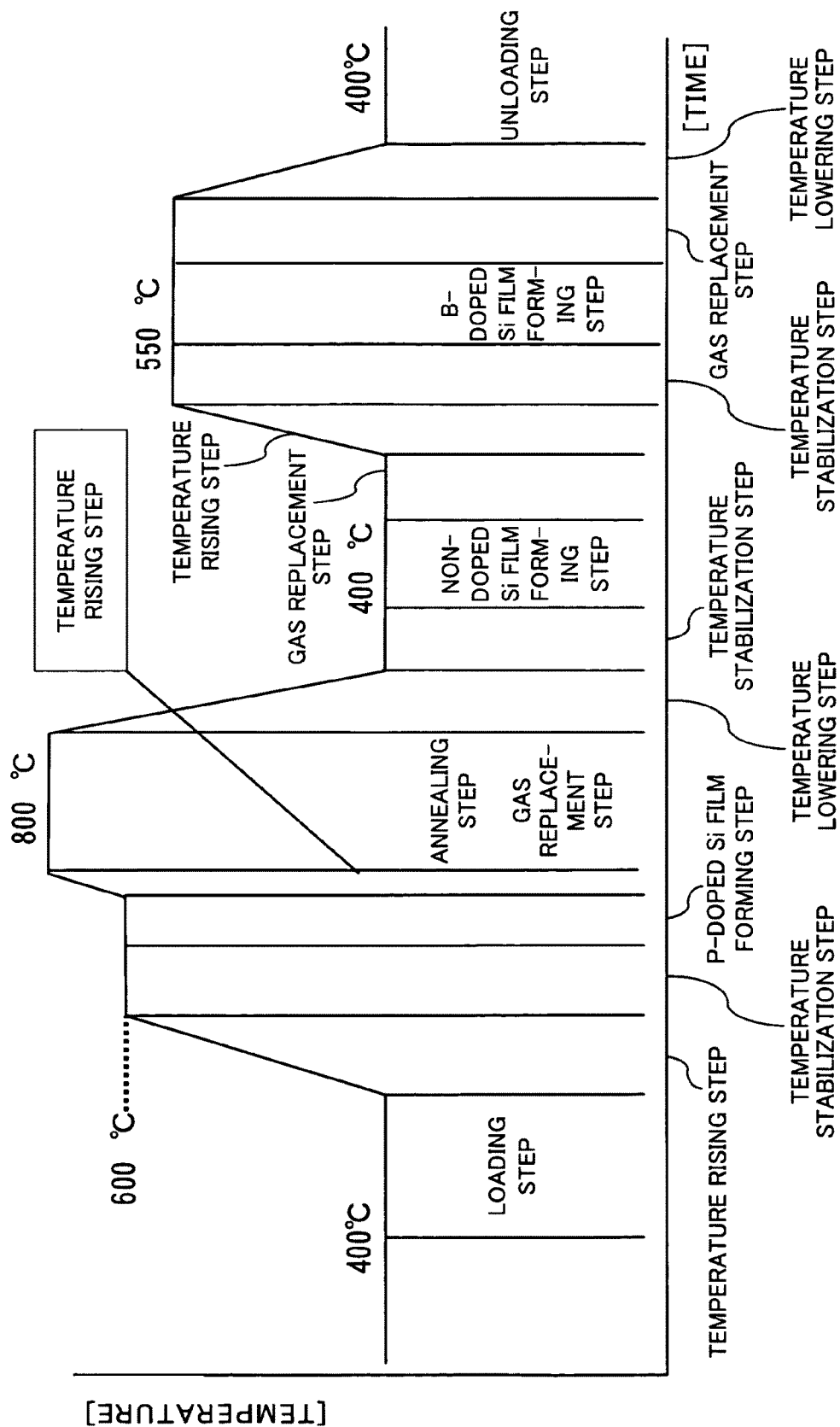
FIG. 12 is a sequence diagram for forming a laminated film of a P-doped Si film, a non-doped Si film, and a B-doped Si film in the eighth embodiment of the invention.

FIG. 12 shows a film formation sequence of the present embodiment in which a laminated film composed of a P-doped Si film as an N-type semiconductor film, a non-doped Si film as an i-type semiconductor film, and a B-doped Si film as a P-type semiconductor film is formed. The difference between this sequence and that of the third embodiment is that after the P-doped Si film has been formed, the temperature is temporarily raised to above that during the formation of the P-doped Si film and then lowered to the film formation temperature of the non-doped Si film and the non-doped Si film is formed. Other features are substantially similar to those of the sequence of the third embodiment.

The wafers are heated to a temperature of 600° C., which is a film formation temperature of the P-doped Si film, inside the reaction chamber and the P-doped Si film is formed on the wafer surface by supplying the $SiH_4$ gas and $PH_3$ gas. The $SiH_4$ gas and $PH_3$ gas are then discharged from the reaction chamber and the temperature in the reaction chamber is raised above that during the formation of the P-doped Si film. The temperature is preferably temporarily raised to 700-850° C. By temporarily raising the temperature, it is possible to discharge a certain amount of P that remains on the inner wall surface of the reaction chamber and further improve the uniformity of P concentration distribution in the P-doped Si film located on the substrate. After a state with a raised temperature has been maintained for a predetermined time, the temperature in the reaction chamber is lowered to 450° C. or a lower temperature and the $Si_2H_6$ gas is supplied into the reaction chamber. By lowering the temperature and using $Si_2H_6$, which has a thermal decomposition temperature lower and reactivity higher (easier self-decomposition) than those of $SiH_4$, it is possible to inhibit the auto-doping of P into the non-doped Si film and realize a sharp impurity profile in the film. In this case, the temperature is preferably lowered to 400° C. or a lower temperature. As a result, the auto-doping of P into the non-doped Si film can be further inhibited and an even sharper impurity profile in the film can be realized.

The $Si_2H_6$ gas is then discharged from the reaction chamber. The reaction chamber temperature is raised to 550° C., and the P-doped Si film is formed on at least the non-doped Si film by supplying the $SiH_4$ gas and $PH_3$ gas into the reaction chamber.

The reaction chamber temperature is then lowered to 400° C. or a lower temperature and the wafers are unloaded from the reaction chamber. With the invention of the present embodiment, it is possible to inhibit the auto-doping of P into the non-doped Si film and realize a sharp impurity profile in the film. Further, where the films are formed on the substrate by a non-plasma processing in this manner, an expensive plasma generator for a plasma processing can be eliminated.
(Other Embodiments)

Various embodiments of the present invention are described above. However, the present invention is not limited to the above-described embodiments.

For example, GAS1 in the first embodiment may be $Si_2H_2Cl_2$ (dichlorosilane) gas rather than the $SiH_4$ gas. In this case, the film formation temperature of the P-doped Si film has to be equal to or higher than 700° C.

Further, the first to eighth embodiments are explained with reference to a case in which the P-doped Si film or B-doped Si film of the first layer is formed on the wafers, but this film may be also formed on another film, provided that it is on a substrate, and the film may be also formed on a substrate in a state in which a multilayer film has already been formed on the wafers.

Various aspects of the present invention will be described below.

The first aspect relates to a method for manufacturing a semiconductor device, including the steps of: loading a substrate into a reaction chamber; supplying reactive gases into the reaction chamber and processing the substrate; and unloading the processed substrate from the reaction chamber, wherein the step of processing the substrate includes: a first film formation step of setting the substrate to a first temperature and forming a first silicon film including impurity atoms on the substrate and a second film formation step of setting the substrate to a second temperature, which is lower than the first temperature, and forming a second silicon film that includes no impurity atoms or has an impurity concentration lower than that of the first silicon film on at least the first silicon film.

The second aspect relates to a method for manufacturing a semiconductor device according to the first aspect, wherein the first silicon film is an N-type semiconductor film or a P-type semiconductor film, and the second silicon film is an i-type semiconductor film.

The third aspect relates to a method for manufacturing a semiconductor device according to the first aspect, wherein in the first film formation step, a first gas including at least silicon atoms and a gas including impurity atoms are supplied. as the reactive gas, and in the second film formation step, at least a second gas that includes silicon atoms and has a thermal decomposition temperature lower than that of the first gas is supplied as the reactive gas.

The fourth aspect relates to a method for manufacturing a semiconductor device according to the first aspect, wherein in the first film formation step, at least a monosilane gas and a gas including impurity atoms are supplied as the reactive gas, and in the second film formation step, at least a disilane gas is supplied as the reactive gas.

The fifth aspect relates to a method for manufacturing a semiconductor device according to the first aspect, wherein the second temperature is lower than the first temperature by 50° C. or more.

The sixth aspect relates to a method for manufacturing a semiconductor device according to the first aspect, wherein a processing of raising the temperature to above the first temperature is performed after the first film formation step, and then the second film formation step is performed.

The seventh aspect relates to a method for manufacturing a semiconductor device according to the first aspect, wherein the step of processing the substrate further has a third film formation step of forming a third silicon film including impurity atoms on at least the second silicon film.

The eighth aspect relates to a method for manufacturing a semiconductor device according to the first aspect, wherein the step of processing the substrate is performed in a non-plasma state.

The ninth aspect relates to a method for manufacturing a semiconductor device according to the first aspect, wherein the first temperature is equal to or higher than 530° C. and equal to or lower than 600° C., and the second temperature is equal to or higher than 380° C. and equal to or lower than 450° C.

The tenth aspect relates to a method for manufacturing a semiconductor device according to the first aspect, wherein a gas replacement step of supplying an inactive gas into the reaction chamber and discharging the first gas and the gas including impurity atoms is conducted between the first film formation step and the second film formation step.

The eleventh aspect relates to a method for manufacturing a semiconductor device according to the seventh aspect, wherein the first silicon film is a P-type semiconductor film, the second silicon film is an i-type semiconductor film, and the third Si film is an N-type semiconductor film.

The twelfth aspect relates to a method for manufacturing a semiconductor device according to the seventh aspect, wherein the first silicon film is an N-type semiconductor film, the second silicon film is an i-type semiconductor film, and the third Si film is a P-type semiconductor film.

The thirteenth aspect relates to a method for manufacturing a semiconductor device according to the seventh aspect, wherein the first silicon film is a P-type semiconductor film, the second silicon film is an i-type semiconductor film, and the third Si film is a P-type semiconductor film.

The fourteenth aspect relates to a method for manufacturing a semiconductor device according to the seventh aspect, wherein the first silicon film is an N-type semiconductor film, the second silicon film is an i-type semiconductor film, and the third Si film is an N-type semiconductor film.

The fifteenth aspect relates to a method for manufacturing a semiconductor device according to the tenth aspect, wherein the substrate temperature is decreased from the first temperature during the gas replacement step.

The sixteenth aspect of the present invention relates to a method for manufacturing a semiconductor substrate by supplying reactive gases into a reactive chamber, including a first film formation step of setting the substrate to a first temperature and forming a first silicon film including impurity atoms on the substrate and a second film formation step of setting the substrate to a second temperature, which is lower than the first temperature, and forming a second silicon film that includes no impurity atoms or has an impurity concentration lower than that of the first silicon film on at least the first silicon film.

The seventeenth aspect of the present invention relates to a substrate processing apparatus including: a reaction chamber where a substrate is processed; a heater that heats the reaction chamber; a gas supply unit that supplies reactive gases into the reaction chamber; an evacuation unit that evacuates the reaction chamber; and a controller that performs control such that the reaction chamber is heated to and maintained at a first temperature with the heater to form a first silicon film including impurity atoms on the substrate, and the reaction chamber is heated to and maintained at a second temperature, which is lower than the first temperature, with the heater to form a second silicon film that includes no impurity atoms or has an impurity concentration lower than that of the first silicon film on at least the first silicon film.

(Other Possible Embodiments)

The present invention can be also implemented with other film formation methods and types of films. In the embodiments above, a vertical substrate processing apparatus is explained by way of example, but the present invention is also applicable to an apparatus for processing sheet-like substrates.

What is claimed is:

1. A method for manufacturing a semiconductor device, comprising the steps of:
   loading a substrate into a reaction chamber;
   supplying reactive gases into the reaction chamber and processing the substrate; and
   unloading the processed substrate from the reaction chamber,
   wherein the step of processing the substrate includes the following sequential steps:
   (i) a first film formation step of setting the substrate to a first temperature and forming a first silicon film on the substrate by using a first reactive gas with a first film-forming reactive compound, the first silicon film including impurity atoms,
   (ii) raising the temperature of the substrate to an interim temperature above the first temperature, and
   (iii) a second film formation step of setting the substrate to a second temperature, which is lower than the first temperature and is lower than a thermal decomposition temperature of the first reactive gas, and forming a second silicon film on at least the first silicon film using a second reactive gas that has a second film-forming reactive compound different from the first film-forming reactive compound, the second silicon film including no impurity atoms or having an impurity concentration lower than that of the first silicon film.

2. The method for manufacturing a semiconductor device according to claim 1, wherein
   in the first film formation step, the first reactive gas includes a gas with at least silicon atoms and a gas including impurity atoms, and in the second film formation step, the second reactive gas includes a gas with at least silicon atoms and the second reactive gas has a thermal decomposition temperature lower than that of the first reactive gas.

3. The method for manufacturing a semiconductor device according to claim 2, wherein a gas replacement step of supplying an inactive gas into the reaction chamber and discharging the first reactive gas and the gas including impurity atoms is conducted between the first film formation step and the second film formation step.

4. The method for manufacturing a semiconductor device according to claim 3, wherein the substrate temperature is decreased from the first temperature during the gas replacement step.

5. The method for manufacturing a semiconductor device according to claim 1, wherein the first reactive gas includes at least a monosilane gas and a gas including impurity atoms, and the second reactive gas includes at least a disilane gas.

6. The method for manufacturing a semiconductor device according to claim 1, wherein the step of processing the substrate further has a third film formation step of forming a third silicon film including impurity atoms on at least the second silicon film.

7. The method for manufacturing a semiconductor device according to claim 1, wherein the substrate processing in the substrate processing step is performed in a non-plasma state.

8. The method for manufacturing a semiconductor device according to claim 1, wherein a difference between the first temperature and the second temperature is equal to or greater than 100° C., and the second temperature is equal to or lower than 450° C.

9. A method for manufacturing a semiconductor device, comprising the steps of:
   loading a substrate into a reaction chamber;
   supplying reactive gases into the reaction chamber and processing the substrate; and
   unloading the processed substrate from the reaction chamber,
   wherein the step of processing the substrate includes the following sequential steps:
   (i) a first film formation step of setting the substrate to a first temperature and forming a first silicon film on the substrate by using a first reactive gas with a first film-forming reactive compound, the first silicon film including impurity atoms,
   (ii) raising the temperature of the substrate to an interim temperature above the first temperature, and
   (iii) a second film formation step of setting the substrate to a second temperature, which is lower than the first temperature, and forming a second silicon film on at least the first silicon film using a second reactive gas that has a second film-forming reactive compound different from the first film-forming reactive compound, the second silicon film including no impurity atoms or having an impurity concentration lower than that of the first silicon film; and
   wherein the first temperature is equal to or higher than 530° C. and equal to or lower than 600° C., and the second temperature is equal to or higher than 380° C. and equal to or lower than 450° C.

10. The method for manufacturing a semiconductor device according to claim 9, wherein the second temperature is lower than a thermal decomposition temperature of the first reactive gas.

11. A method for manufacturing a semiconductor device, comprising the steps of:
   loading a substrate into a reaction chamber;
   supplying reactive gases into the reaction chamber and processing the substrate; and
   unloading the processed substrate from the reaction chamber,
   wherein the step of processing the substrate includes the following sequential steps:
   (i) a first film formation step of setting the substrate to a first temperature and forming a first silicon film on the substrate using a first reactive gas with a first film-forming reactive compound, the first silicon film including impurity atoms,
   (ii) raising the temperature of the substrate to an interim temperature above the first temperature, and
   (iii) a second film formation step of setting the substrate to a second temperature, which is lower than the first temperature, and forming a second silicon film on at least the first silicon film using a second reactive gas that has a second film-forming reactive compound different from the first film-forming reactive compound, the second silicon film including no impurity atoms or having an impurity concentration lower than that of the first silicon film.

* * * * *